US009562291B2

(12) United States Patent
Tice et al.

(10) Patent No.: US 9,562,291 B2
(45) Date of Patent: Feb. 7, 2017

(54) METAL ETCH SYSTEM

(71) Applicant: MEI, LLC, Albany, OR (US)

(72) Inventors: Scott Tice, Albany, OR (US); Jeffrey M. Wagner, Corvallis, OR (US)

(73) Assignee: MEI, LLC, Albany, OR (US)

( * ) Notice: Subject to any disclaimer, the term of this patent is extended or adjusted under 35 U.S.C. 154(b) by 0 days.

(21) Appl. No.: 14/508,648

(22) Filed: Oct. 7, 2014

(65) Prior Publication Data

US 2015/0197861 A1 Jul. 16, 2015

Related U.S. Application Data

(60) Provisional application No. 61/927,027, filed on Jan. 14, 2014.

(51) Int. Cl.
  C23F 1/00 (2006.01)
  C23F 1/08 (2006.01)
  C23F 1/14 (2006.01)
  H01L 21/3213 (2006.01)
  H01L 21/67 (2006.01)

(52) U.S. Cl.
  CPC . *C23F 1/08* (2013.01); *C23F 1/14* (2013.01); *H01L 21/32134* (2013.01); *H01L 21/67086* (2013.01)

(58) Field of Classification Search
  CPC .......... B01J 6/00; C10J 2200/09; C10J 3/485; C23F 1/08; H01L 21/30604; H01L 21/30608; H01L 21/67028; H01L 21/67017; H01L 21/67086
  USPC . 156/345.1, 345.11, 345.21, 345.23; 216/89, 216/90, 91
  See application file for complete search history.

(56) References Cited

U.S. PATENT DOCUMENTS

| 3,677,848 | A |   | 7/1972 | Stoller et al. |
| 4,980,300 | A | * | 12/1990 | Miyashita ........... H01L 21/3221 134/1 |
| 5,340,437 | A |   | 8/1994 | Erk et al. |
| 5,593,505 | A |   | 1/1997 | Erk et al. |
| 5,672,212 | A | * | 9/1997 | Manos .............. H01L 21/67023 134/1.3 |
| 5,839,460 | A | * | 11/1998 | Chai ...................... B08B 3/102 134/147 |
| 5,843,322 | A |   | 12/1998 | Chandler, Jr. |
| 5,914,281 | A |   | 6/1999 | Abe et al. |
| 5,932,027 | A |   | 8/1999 | Mohindra et al. |
| 6,123,865 | A |   | 9/2000 | Lin et al. |

(Continued)

*Primary Examiner* — Lan Vinh

(74) *Attorney, Agent, or Firm* — Klarquist Sparkman, LLP

(57) ABSTRACT

Embodiments of systems and methods of etching material from the surface of a wafer are provided. In one representative embodiment, an apparatus comprises a fluid reservoir configured to receive a fluid including an etchant and one or more wafers in a cassette. The apparatus can further comprise a roller member in the fluid reservoir to frictionally engage the one or more wafers and to displace the one or more wafers with respect to a bottom portion of the cassette when the cassette is in the fluid reservoir. The apparatus can further comprise a motor outside the fluid reservoir and magnetically coupled to the roller member such that activation of the motor causes corresponding rotation of the roller member, and thereby rotation of the one or more wafers when the roller member is in frictional engagement with the one or more wafers.

24 Claims, 16 Drawing Sheets

(56) References Cited

U.S. PATENT DOCUMENTS

| | | | | |
|---|---|---|---|---|
| 6,337,030 B1* | 1/2002 | Sakaguchi | ........ | H01L 21/02019 156/345.23 |
| 2004/0152319 A1* | 8/2004 | Yamagata | ................ | C30B 29/06 438/689 |
| 2004/0194814 A1* | 10/2004 | Nishimura | ............. | C11D 7/261 134/32 |
| 2007/0267040 A1* | 11/2007 | Watanabe | ......... | H01L 21/67057 134/1 |
| 2012/0240958 A1 | 9/2012 | Higuchi et al. | | |
| 2014/0273500 A1 | 9/2014 | Tice | | |

* cited by examiner

FIG. 4

METAL ETCH SYSTEM

CROSS REFERENCE TO RELATED APPLICATION

This application claims the benefit of U.S. Provisional Patent Application No. 61/927,027, filed Jan. 14, 2014, which is hereby incorporated herein by reference in its entirety.

FIELD

The present disclosure is directed to the field of metal etching systems, and in particular to improved wet-etching systems.

BACKGROUND

Wet-etching can refer to the use of chemical baths to dissolve portions of a metal layer situated on a wafer. Wet-etching techniques are often simpler and less expensive than dry-etching or de-plating techniques, but can be highly isotropic, which can amplify surface irregularities on the wafers. Conventional wet-etching systems also typically suffer from poor chemical usage owing to the boundary layer established between the wafer surface and the chemical bath, which tends to restrict both the flow of spent etchant away from the wafer surface and the flow of fresh etchant against the wafer surface. Further, the cassettes or cassettes in which wafers are situated when in the chemical bath can restrict the flow of etchant against certain regions of the wafer surface, causing those regions to etch at different rates than other regions of the wafer surface. Accordingly, improvements to wet-etching systems are desirable.

SUMMARY

Certain embodiments of the disclosure concern systems and methods of etching material from the surface of a wafer. In one representative embodiment, an apparatus comprises a fluid reservoir configured to receive a fluid including an etchant and one or more wafers situated in a cassette. The apparatus further comprises a roller member situated in the fluid reservoir to frictionally engage the one or more wafers when the cassette is in the fluid reservoir. The apparatus further comprises a motor situated outside the fluid reservoir and coupled to the roller member such that rotation of the motor causes corresponding rotation of the roller member, and thereby rotation of the one or more wafers when the roller member is in frictional engagement with the one or more wafers. The one or more wafers can be displaced with respect to a bottom portion of the cassette when the cassette is in the fluid reservoir.

In another representative embodiment, an apparatus comprises a fluid reservoir configured to receive a fluid including an etchant and a cassette configured to receive one or more wafers, and a roller member in the fluid reservoir to frictionally engage the one or more wafers when the cassette is in the fluid reservoir. The apparatus further comprises a motor situated outside the fluid reservoir and coupled to the roller member such that activation of the motor causes corresponding rotation of the roller member and rotation of the one or more wafers when the roller member is in frictional engagement with the one or more wafers, and a fluid agitator in fluid communication with the fluid reservoir to introduce bubbles into the fluid when the fluid is in the fluid reservoir.

In another representative embodiment, a method comprises positioning a cassette including one or more wafers situated therein in a fluid reservoir containing a fluid, displacing the one or more wafers from a bottom portion of the cassette, rotating the one or more wafers in the cassette, and bubbling a gas through the fluid in the fluid reservoir such that bubbles pass through the cassette.

In another representative embodiment, an apparatus comprises a fluid reservoir configured to receive one or more wafers in a cassette, and a roller member situated in the fluid reservoir to frictionally engage the one or more wafers when the cassette is in the fluid reservoir. The roller member can further displace the one or more wafers with respect to a bottom portion of the cassette such that the one or more wafers can be rotated by the roller within the cassette while simultaneously being displaced from the bottom of the cassette. The apparatus can further comprise a motor situated outside the fluid reservoir and magnetically coupled to the roller member such that rotation of the motor causes corresponding rotation of the roller member, and thereby rotation of the one or more wafers within the cassette when the cassette is in the fluid reservoir. The apparatus can further comprise a fluid agitator in fluid communication with the fluid reservoir to introduce gas bubbles of a predetermined size into a fluid when the fluid is received by the fluid reservoir, and one or more bubble guide members to guide gas bubbles introduced into the fluid by the fluid agitator into the cassette at particular angles and particular directions.

The foregoing and other objects, features, and advantages of the disclosure will become more apparent from the following detailed description, which proceeds with reference to the accompanying figures.

BRIEF DESCRIPTION OF THE DRAWINGS

FIG. 4 illustrates a cross-sectional view of the fluid reservoir assembly of FIG. 2 taken along line 4-4 of FIG. 2.

DETAILED DESCRIPTION

Figure 1:
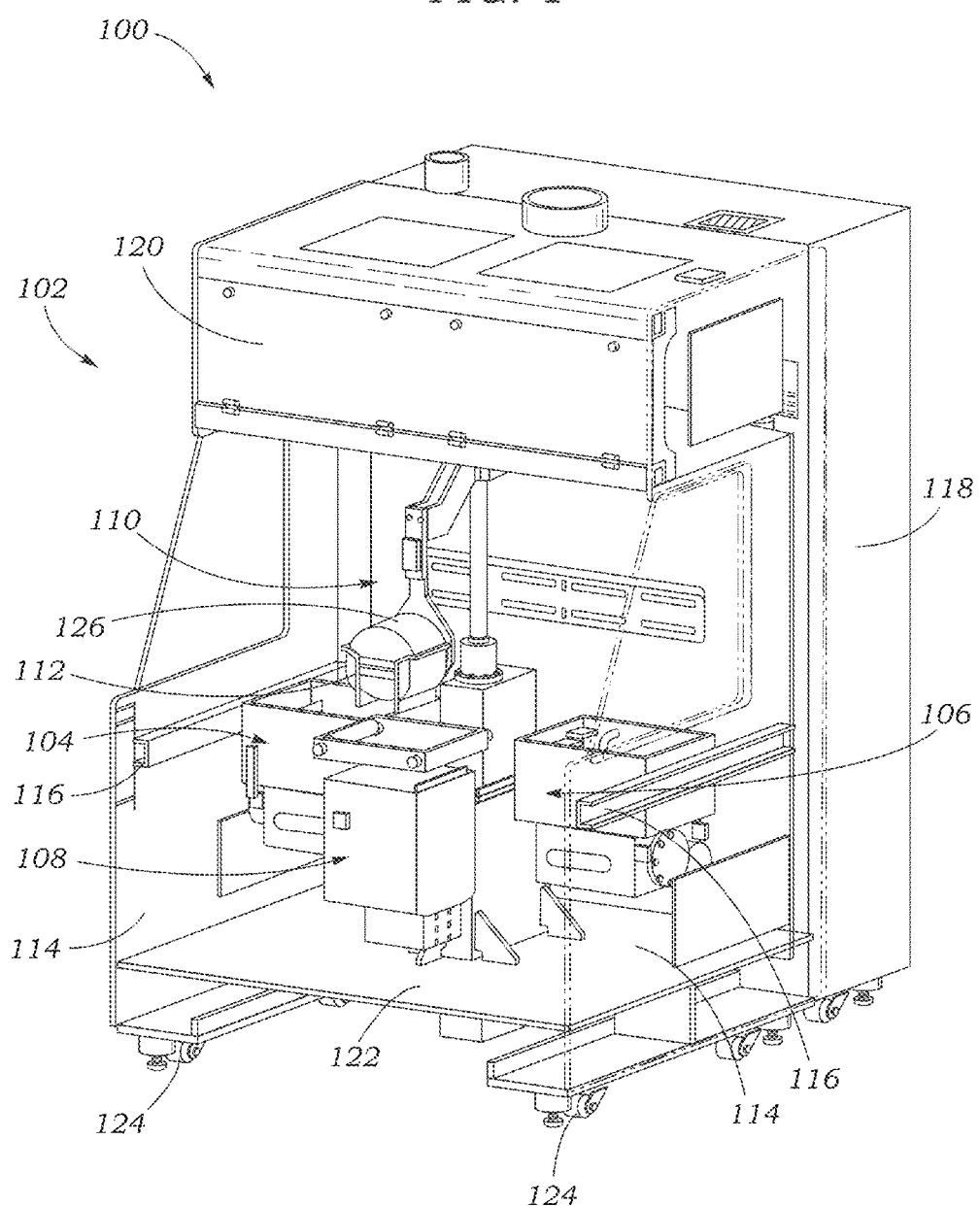
FIG. 1 illustrates a perspective view of a representative embodiment of a wet-etching system with a front panel removed for purposes of illustration.

For purposes of this description, certain aspects, advantages, and novel features of the embodiments of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In some examples, values, procedures, or apparatus may be referred to as "lowest," "best," "minimum," or the like. It will be appreciated that such descriptions are intended to indicate that a selection among many alternatives can be made, and such selections need not be better, smaller, or otherwise preferable to other selections.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. If allowed, fluids generally flow under gravity toward the bottom of a system and gases within the fluid generally flow through the fluid toward the top of the system.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under standard test conditions/methods as understood by those of ordinary skill in the art. When directly and explicitly distinguishing embodiments from discussed prior art, the embodiment numbers are not approximates unless the word "about" is recited. Furthermore, not all alternatives recited herein are equivalents unless expressly stated otherwise.

The systems, methods and devices disclosed herein can be used in semiconductor wafer fabrication processes such as material-etching processes. Etching can refer to the process of removing material, such as metal, from the surface of a wafer, and can be used to pattern films on the wafer to form desired features (e.g., conductive pathways, interconnects, etc.). The systems, methods, and devices disclosed herein can be used to significantly improve wet-etch processing and, thus, can offer high-quality etching at much lower prices than other etching techniques, such as dry-etching or de-plating systems. For example, certain embodiments of the systems, methods, and devices disclosed herein are capable of providing greatly improved within-wafer (WIW) uniformity, such as WIW uniformities below 5% and, in some cases, less than 2% for a 200 mm wafer. As used herein, the term "within-wafer uniformity" ("WIW") refers to a measure of the planarization of the surface of a wafer, and is typically expressed as a percentage by which the thickness of a material at various points on the wafer surface varies with respect to a median value. Within-wafer uniformity can be determined using, for example, any of various multipoint probe metrology systems to measure electrical resistance of a wafer surface before and after processing by a wet-etching system. The electrical resistance values can then be used in combination with parameters such as etch rate, material thickness, etc., to determine the relative consistency of material removal at various locations on the wafer surface by the wet-etching system.

Referring to wet-etch systems generally, the systems disclosed herein can include one or more fluid reservoirs configured to receive a plurality of wafers in a cassette, and can include one or more inlets through which an etching fluid can be provided. The fluid reservoir can be configured such that the fluid can be introduced at a bottom end portion of the fluid reservoir and flow upward through the fluid reservoir around the wafers to a top end portion of the fluid reservoir. As the fluid flows past the wafers, the etchant can etch material from one or more surfaces of the wafers.

In certain embodiments of the disclosed apparatus, the fluid reservoir further includes a fluid agitator situated below the wafers and configured to agitate the fluid during material-etching processes by, for example, introducing gas bubbles into the fluid. The gas bubbles act to mix the fluid in the reservoir to help ensure a uniform concentration of etchants throughout the volume of fluid, as well as to disrupt the formation of fluid boundary layers near the wafer surfaces such that the entire wafer surface is exposed to etchant. This can improve surface uniformity as well as promote a consistent etch rate both with respect to different regions of the surface of a single wafer, and between different wafers in the cassette by facilitating the movement of depleted etchant and etched material away from the wafer surface and the movement of fresh etchant against the wafer surface. Additionally, the fluid agitator can be configured to vary the frequency and/or size of bubbles generated at a plurality of predetermined regions within the fluid reservoir corresponding to different portions of the wafers to further improve etching uniformity.

The fluid reservoir can also include a motor situated outside the fluid reservoir and a roller member situated within the fluid reservoir configured to cause rotation of the wafers in the cassette. Rotation of the wafers in the cassette during metal-etching processes can further improve the uniformity and consistency of etching. In some cases, the motor can be coupled to the roller assembly magnetically, such that the motor is not in contact with the fluid in the fluid reservoir, which can reduce exposure of the motor components to corrosive etchant fluids.

In some embodiments, the cassette can be movable between a raised position and lowered position to selectively situate the plurality of wafers in the fluid reservoir. The cassette can also be configured such that when the cassette is in the fluid reservoir, the roller member engages the wafers to displace the wafers above a bottom portion of the cassette so as to reduce interference in the etching process caused by proximity of the cassette structure to the wafers. Representative embodiments of a fluid reservoir, a cassette, a roller member, and a motor are further described below. It has been found that rotation of the wafers while simultaneously displacing the wafers from the bottom portion of the cassette during etching act synergistically to provide improved wafer surface uniformity as compared to conventional wet-etching techniques.

It has also been found that agitating the fluid by introducing bubbles of an inert gas into different regions of the fluid reservoir at different rates, rotation of the wafers, and displacement of the wafers relative to the cassette also act synergistically to provide surprisingly superior wafer surface uniformity during etching processes as compared to conventional wet-etching techniques. Additionally, certain embodiments of the systems described herein can be less expensive, more compact, and/or easier to maintain than conventional wet-etching systems. Certain embodiments of the disclosed systems reduce the quantity of etchant chemicals required, provide greater throughput, and/or eliminate processing steps relative to conventional etching systems.

Example 1

Representative Wet-Etching System

FIG. 1 illustrates a perspective view of a representative embodiment of a wet-etching system 100 (also referred to as a "wet-etching tool"), including an outer housing or enclosure 102. The enclosure 102 can include first and second side walls 114, a rear portion 118, a hood 120, a floor 122, and, if desired, a plurality of wheels 124. The system 100 can also include a first fluid reservoir assembly 104, a second fluid reservoir assembly 106, a rinse tank or reservoir 108, and a robotic arm or manipulator 110. In the embodiment shown, the first and second fluid reservoir assemblies 104, 106 can be mounted on the sidewalls 114, such as on mounting tracks 116. The manipulator 110 can be used to move or manipulate a cassette 112 (also referred to as a "cassette") among the first and second fluid reservoir assemblies 104, 106, and the rinse tank 108. The cassette 112 can be configured to receive one or more semiconductor wafers illustrated schematically at 126, and can be lowered into the first reservoir assembly 104, the second reservoir assembly 106, and/or the rinse tank 108 by the manipulator 110.

Example 2

Representative Fluid Reservoir Assembly

Figure 2:
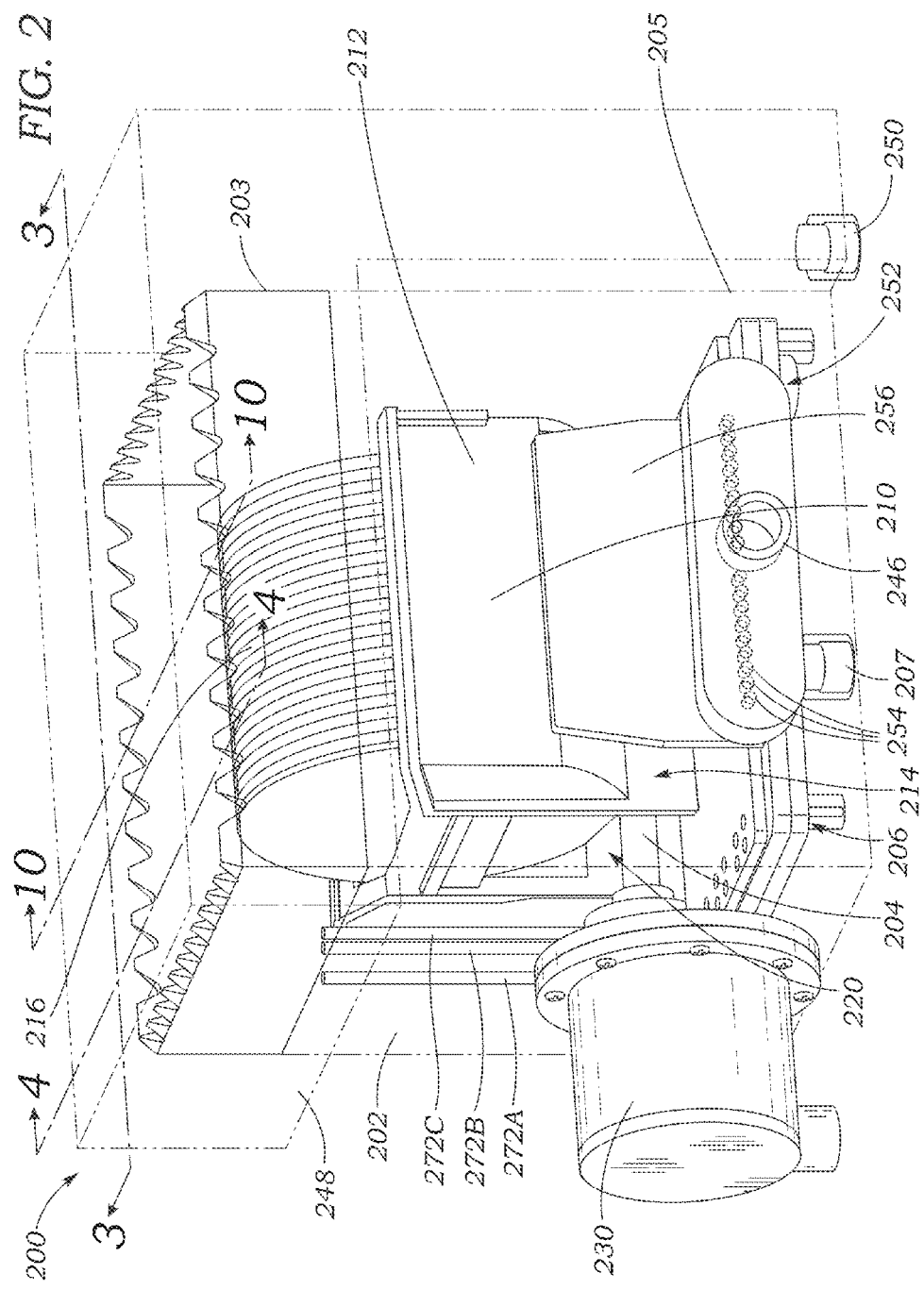
FIG. 2 illustrates a perspective view of a representative embodiment of a fluid reservoir assembly.

FIG. 2 illustrates a perspective view of a representative embodiment of a fluid reservoir assembly 200 that can be used in combination with the wet-etching system 100 as, for example, fluid reservoir assemblies 104 and/or 106. The fluid reservoir assembly 200 can include a substantially rectangular tank or fluid reservoir 202, a roller member 204 situated in the fluid reservoir 202, and a fluid agitator 206 situated beneath the roller member 204. The fluid reservoir assembly 200 can also include a motor 208 situated outside the fluid reservoir 202 and coupled to the roller member 204. In some embodiments, the fluid reservoir assembly 200 can be a discrete unit such that any suitable number of fluid reservoir assemblies can be incorporated into a wet-etching system, such as the system 100 of FIG. 1.

The fluid reservoir 202 can have an upper portion 203 and a lower portion 205, and can be configured to receive a fluid including one or more etchants (for example, for processing semiconductor wafers) via one or more inlet ports 246 in fluid communication with the lower portion 205 of the fluid reservoir 202. In some embodiments, the upper portion 203 of the fluid reservoir 202 can be notched to allow controlled overflow of fluid out of the fluid reservoir 202 when, for example, a cassette is in the fluid reservoir 202. The fluid reservoir 202 can also include an overflow collection enclosure 248 (indicated in phantom), which can be configured to receive fluid that overflows the fluid reservoir 202, and to direct the fluid toward a port 250 located adjacent the lower portion 205 of the fluid reservoir 202. In some embodiments, the port 250 can be in communication with a recirculation pump, which can recirculate the fluid back into the fluid reservoir 202. The fluid reservoir 202 can further include a drain 207 situated in the lower portion 205 of the fluid reservoir 202 for draining fluid directly from the fluid reservoir 202.

Each of the inlet ports 246 can be in fluid communication with a respective diffuser chamber, such as the diffuser chamber 252 shown in FIG. 2. Referring specifically to the diffuser chamber 252 for purposes of illustration, the diffuser chamber 252 can be mounted adjacent the lower portion 205 of the fluid reservoir 202, and can include a plurality of diffuser openings 254 defined therein along a portion of the length of the diffuser chamber 252. The diffuser openings 254 can be in fluid communication with the interior of the fluid reservoir 202 such that a fluid can be supplied to the diffuser chamber 252 via the inlet 246, and thereby diffused into the fluid reservoir 202 in a controlled manner via the plurality of diffuser openings 254. This can help to promote, for example, even distribution of fluid into the fluid reservoir 202 and, thereby a uniform concentration of etchants throughout the volume of the fluid reservoir 202. In operation, fluid can be diffused into the lower portion 205 of the fluid reservoir 202 via the diffuser chamber 252, and can flow upwardly toward the upper portion 203 of the fluid reservoir 202. Excess fluid can flow over the upper portion 203 of the fluid reservoir 202, and can be collected by the overflow collection enclosure 248 for recirculation via the port 250.

Figure 3:
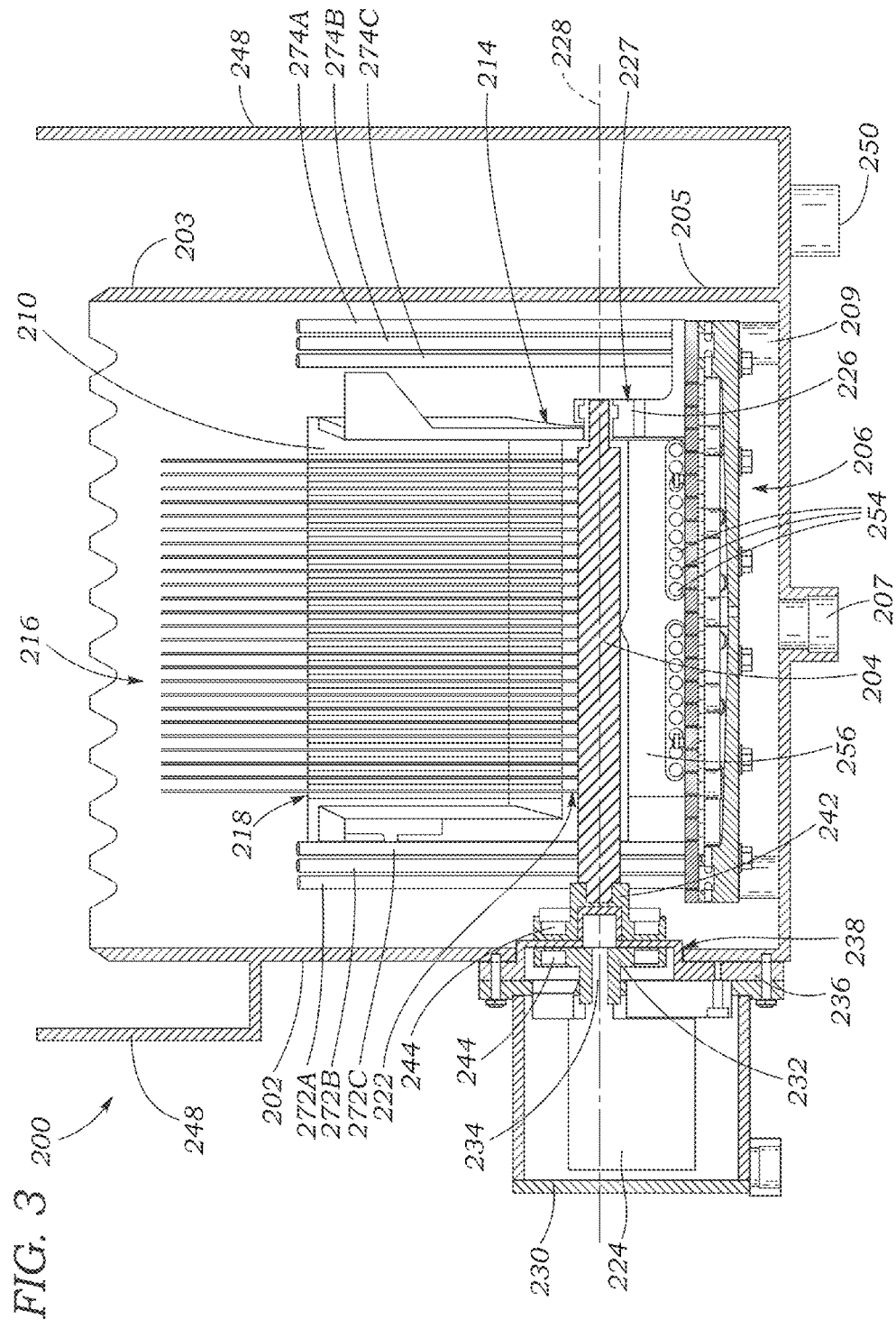
FIG. 3 illustrates a cross-sectional side elevation view of the fluid reservoir assembly of FIG. 2 taken along line 3-3 of FIG. 2.

Referring to FIGS. 2 and 3, the fluid reservoir 202 can be configured to receive a cassette 210, which can be movable between a raised position, in which the cassette 210 is positioned above the fluid reservoir 202 (see, e.g., cassette 112 of FIG. 1), and a lowered position, in which the cassette 210 is in the fluid reservoir 202 and, thereby, immersed in the fluid contained in the reservoir 202 (see FIG. 2). The cassette 210 can include side walls 212 and a bottom portion 214, and can be configured to receive a plurality of wafers 216. To that end, the side walls 212 can include a plurality of slots 218 (FIG. 3) configured such that when the wafers 216 are received in the slots 218, the wafers 216 can be situated parallel to and spaced apart from one another in an upright configuration in the cassette 210. The side walls 212 and the bottom portion 214 can also be contoured such that a curvature of the side walls 210 and the bottom portion 212 approximates a curvature of the wafers 216, allowing a perimeter or edge portion 222 of the wafers 216 to contact the side walls 212 and/or the bottom portion 214 when the wafers 216 are received in the cassette 210.

Figure 4:
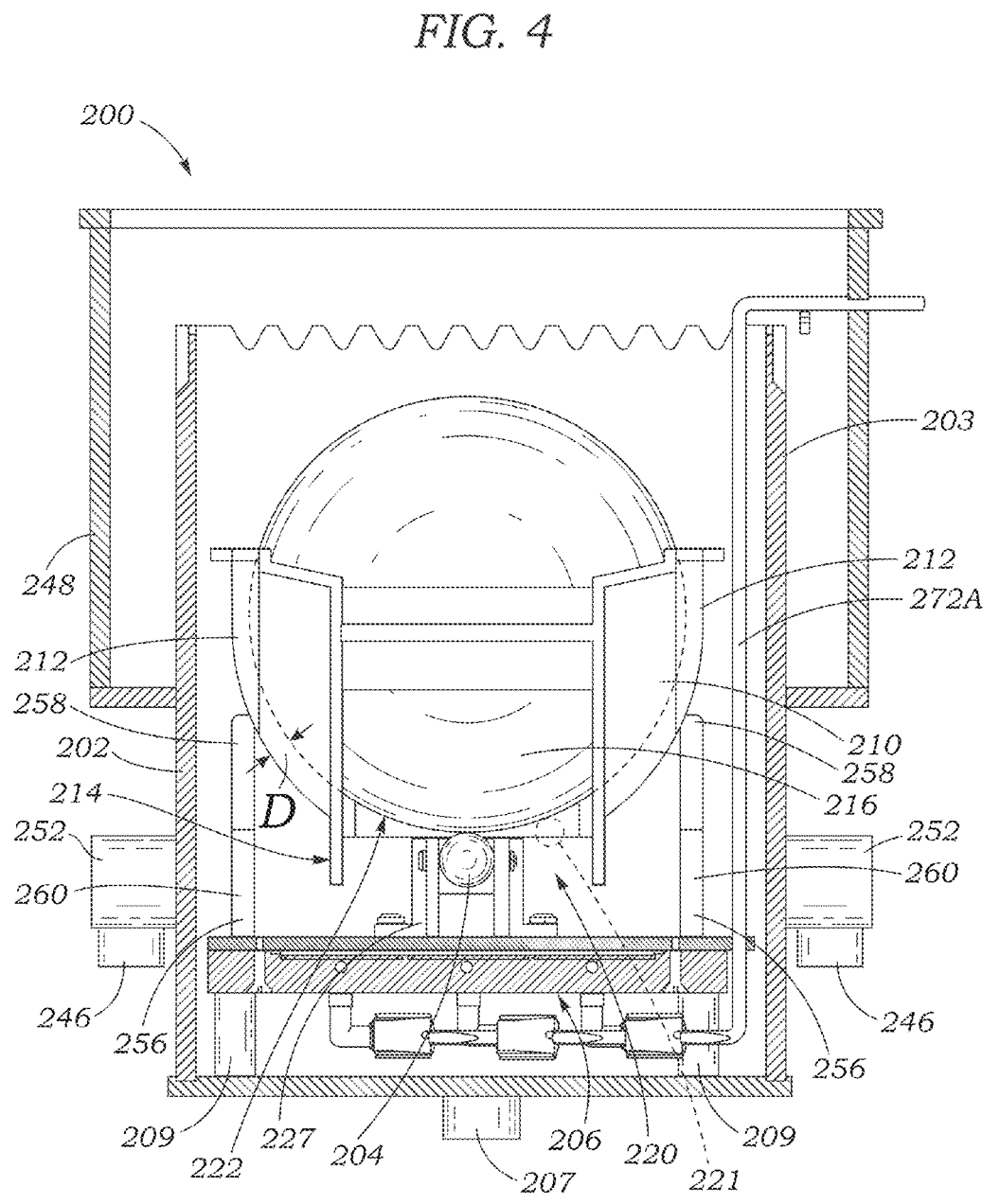

Referring to FIGS. 2, 3, and 4, the bottom portion 214 of the cassette 210 can define an opening generally indicated at 220. In the embodiment shown, the opening 220 can extend along the length of the cassette 210, and can allow fluid to flow into the cassette 210 as the cassette 210 is lowered into the fluid reservoir 202. The opening 220 can also be configured such that the edge portion 222 of each of the respective wafers 216 is accessible via the opening 220 to allow the roller member 204 to contact the edge portions 222 of the wafers 216, as further described below.

Referring to FIG. 3, the roller member 204 can extend along the length of the fluid reservoir 202 such that a longitudinal axis 228 of the roller member 204 is oriented perpendicular to the wafers 216 in the cassette 210. The roller member 204 can be coupled at one end to a motor 224, and to a bearing 226 supported by a fixture 227 at the opposite end of the fluid reservoir 202 from the motor 224. In this manner, the roller member 204 can be rotated within the fluid reservoir 202 by the motor 224. In some embodiments, the roller member 204 can be supported at one or both ends by spherical bearings, which can reduce the required degree of alignment precision and wear of rotating parts.

In some embodiments, the roller member 204 can be mounted in the fluid reservoir 202 such that as the cassette 210 is lowered into the fluid reservoir 202, the roller member 204 can pass through the opening 220 in the cassette 210 and contact the edge portions 222 of the wafers 216, thereby displacing (e.g., lifting) the wafers 216 a distance D from the bottom portion 214 of the cassette 210, as shown in FIG. 4. In other words, the cassette 210 can be situated in the fluid reservoir 202 such that the edge portions 222 of the wafers 216 contact the roller member 204 and are lifted off of the bottom portion 214 of the cassette 210 a distance D as the cassette 210 is lowered into the fluid reservoir 202. This can allow greater fluid flow around the edges of the wafers 216 during processing, which can help to minimize the shadowing effect caused by proximity of the cassette 210 to certain portions of the wafers 216.

In some embodiments, the distance D can be a proportion of the diameter of the wafers 216. For example, in some embodiments, the distance D can be 5% of the diameter of the wafers 216, 10% of the diameter of the wafers 216, 15% of the diameter of the wafers 216, etc. In some embodiments, the distance D can be related to the diameter of the roller member 204. For example, in some embodiments, the distance D can be 50% of the diameter of the roller member 204. In some embodiments, the distance D can be a specific measurement regardless of the size of the wafers, such as one to two inches.

In some embodiments, the wafers 216 need not be displaced from the bottom portion 214 of the cassette 210 by the roller member 204, but may be displaced by any other suitable member or structure located inside or outside the cassette 210. For example, the wafers 216 can be displaced by a displacement mechanism or member indicated in phantom at 221 that is separate from the roller member 204 and configured to displace the wafers 216 with respect to the bottom portion 214 of the cassette 210. In some embodiments, the displacement member 221 can be configured to displace the wafers 216 when the wafers 216 are not being rotated by the roller member 204. In some embodiments, the displacement member 221 can be configured to displace the wafers 216 from the bottom portion 214 of the cassette 210 while the wafers 216 are being rotated by the roller member 204. In some embodiments, the roller member 204 can displace the wafers 216, and the manipulator 110 can be configured to rotate the wafers 216 or otherwise move the wafers 216 in the fluid within the fluid reservoir 202.

Referring again to FIG. 3, the motor 224 can be housed in a motor housing 230 mounted on the exterior of the fluid reservoir 202, and can be coupled to a driving hub 232 via an output shaft 234. The driving hub 232 can be situated in a mounting plate 236, which can be sealingly received in an opening 238 in the fluid reservoir 202. As shown in FIG. 3, the driving hub 232 and a driven hub 242 coupled to the roller member 204 can each include a plurality of magnet elements 244 situated opposite one another across the mounting plate 236. The respective magnet elements 244 of the driving hub 232 and the driven hub 242 can be spaced apart from and magnetically coupled to one another across the mounting plate 236 such that rotation of the driving hub 232 (for example, by the motor 224) causes corresponding rotation of the driven hub 242 and, hence, of the roller member 204 about its longitudinal axis 228. In some embodiments, the driven hub 242 can be supported by, and/or rotate about, a protrusion in the wall of the fluid reservoir 202.

In this manner, the roller member 204 can be rotated within the fluid reservoir 202 without the need for a direct mechanical linkage between the roller member 204 and the motor 224. This can reduce the risk of leakage by eliminating leak-prone sealing elements required to seal shafts or other torque transfer mechanisms across the wall of the fluid reservoir 202, and can reduce the introduction of contaminants and particulates into the fluid reservoir caused by, for example, wear of moving parts, leakage of lubricants from bearings, etc. However, in alternative embodiments, the roller assembly 204 may be mechanically linked across the wall of the fluid reservoir. In further alternative embodiments, the roller assembly 204 can be rotated by, for example, a stator situated outside the fluid reservoir 202 and configured to rotate a rotor situated inside the fluid reservoir via a changing magnetic field produced by the stator.

Referring again to FIGS. 2 and 3, the fluid agitator 206 can be situated in the lower portion 205 of the fluid reservoir 202, and can be configured to agitate the fluid in the fluid reservoir by introducing gas bubbles of an inert gas (for example, nitrogen) into the fluid in a controlled manner, as further described below. In the embodiment shown, the fluid agitator 206 can be situated on support members 209 (see, e.g., FIGS. 3 and 4) such that fluid agitator 206 is spaced apart from the bottom of the fluid reservoir 202. The fluid agitator 206 can also be located such that when the cassette 210 is in the fluid reservoir 202, the cassette 210 is positioned above the fluid agitator 206 and spaced apart from the fluid agitator 206 by one or more bubble guide members 256, as shown in FIGS. 4 and 5.

Referring to the bubble guide members 256 in more detail, the fluid reservoir assembly 200 can include two bubble guide members 256 situated in the fluid reservoir 202 to guide gas bubbles introduced into the fluid by the fluid agitator 206 into the cassette 210. In the embodiment shown, the bubble guide members 256 can be situated near the edges of a top plate 264 of the fluid agitator 206, and can be coupled to the fluid agitator 206 in a rigid manner. For example, in the embodiment shown, the bubble guide members 256 can be coupled to the fluid agitator 206 by a plurality of fasteners 257 configured to be received in a plurality of respective fastener openings 259. The bubble guide members 256 can include respective upper portions 258 and lower portions 260. In the embodiment shown, the lower portions 258 can comprise two extensions, which can be received in openings 261 defined in the fluid agitator 206.

Figure 10:
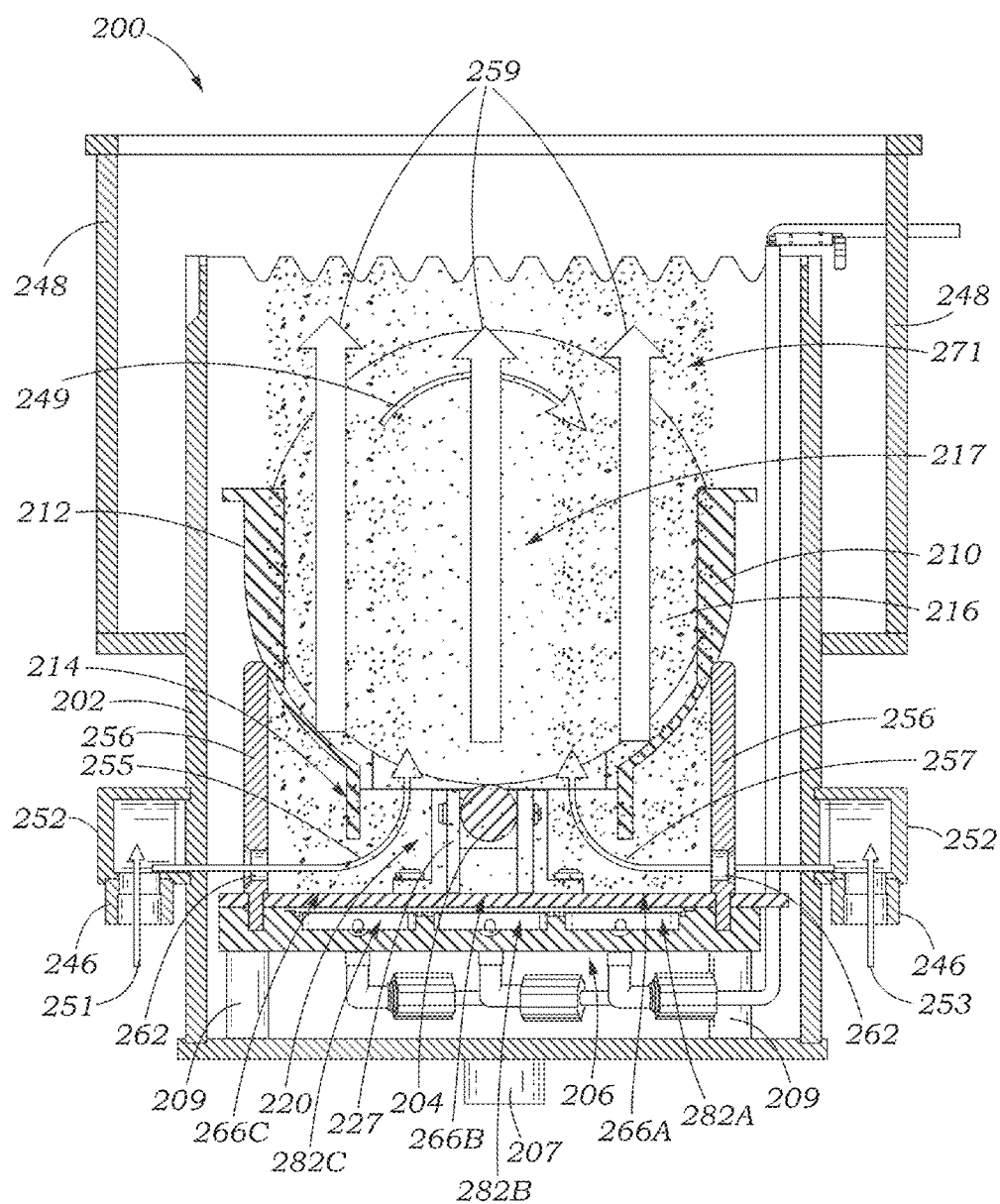
FIG. 10 is a cross-sectional view of the fluid reservoir assembly of FIG. 2 in operation.

The upper portions 258 can be configured to contact the cassette 210 when the cassette 210 is in the fluid reservoir 202, as shown in FIG. 4. In this manner, the bubble guide members 256 can restrict further movement of the cassette 210 when the cassette 210 is lowered into the fluid reservoir 202 such that the cassette 210 is suspended above the fluid agitator 206. Furthermore, the bubble guide members 256 can guide gas bubbles introduced into the fluid by the fluid agitator 206 into the cassette 210 such that gas bubbles are substantially prevented from traveling around the outside of the cassette 210 when the cassette 210 is situated on the upper portions 258 of the bubble guide members 256. In this manner, the gas bubbles can be guided into the cassette 210 via the opening 220, as shown in FIG. 10, which can allow the bubbles to locally mix (i.e., agitate) the fluid adjacent the wafers 216 such that fresh etchant can flow against the surfaces of the wafers 216 and spent etchant can flow away from the surfaces of the wafers 216. This can help to stir or agitate the boundary layer proximate the surfaces of the wafers 216, which can improve etch rate and uniformity across the wafer surface.

Figure 5:
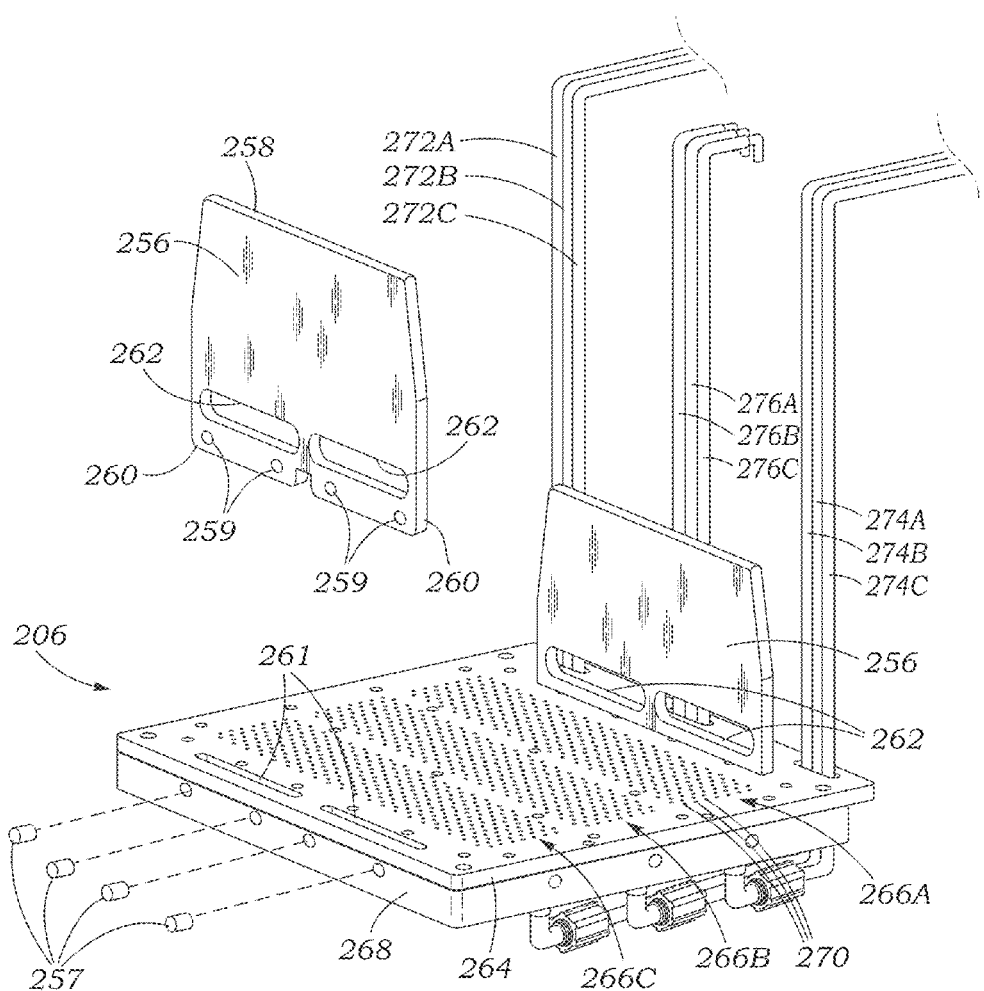
FIG. 5 illustrates a perspective view of a representative embodiment of a fluid agitator.

Referring to FIG. 5, the bubble guide members 256 can each define one or more guide member openings 262. The guide member openings 262 can be located on the respective lower portions 260 of the bubble guide members 256 such that when the bubble guide members 256 are coupled to the fluid agitator 206, the guide member openings 262 are substantially aligned with the diffuser openings 254 of the diffuser chamber 252. In this manner, fluid flowing into the fluid reservoir 202 from the diffuser openings 254 can pass through the guide member openings 262, and flow upwardly across the wafers 216 in the cassette 210 toward the top of the fluid reservoir 202.

The fluid agitator 206 can include a main body portion 268, with the top plate 264 situated on top of the main body portion 268. The top plate 264 can include a plurality of fluid agitator regions defined on the surface of the top plate 264, such as the fluid agitator regions 266A-266C illustrated in FIG. 5. The fluid agitator regions 266A-266C can be rectangularly-shaped, and can extend along a length of the fluid agitator 206. In some embodiments, the fluid agitator regions 266A-266C can have a length corresponding to a length of the cassette 210, and can be configured to agitate the fluid proximate the wafers 216 by introducing gas bubbles into the fluid such that the gas bubbles flow into the cassette 210 when the cassette 210 is in the fluid reservoir 202. In some embodiments, the fluid agitator regions 266A-266C can be spaced apart from one another such that bubbles generated by each respective fluid agitator region 266A-266C flow into different portions of the cassette 210 and/or adjacent different regions of the wafers 216, as further described below. In some embodiments, the fluid agitator regions 266A-266C can be configured to agitate the fluid at different rates by introducing bubbles into the fluid at different rates. This can allow the rate at which material is etched from different regions of the wafer surfaces to be controlled according to their location in the fluid reservoir 202 with respect to the fluid agitator regions 266A-266C. In alternative embodiments, the fluid agitator 206 can include any suitable number of fluid agitator regions having any suitable shape and/or orientation.

Each of the fluid agitator regions 266A-266C can include a plurality of fluid agitator openings 270 defined in the top plate 264. The fluid agitator openings 270 can be configured to introduce gas bubbles of a predetermined size into the fluid in the fluid reservoir 202. In some embodiments, the fluid agitator openings 270 can have respective diameters of from 0.01 to 0.2 inch, and can introduce gas bubbles having corresponding diameters into the fluid. In some embodiments, the fluid agitator openings 270 can have a diameter of from 0.04 inch to 0.12 inch such that they can produce gas bubbles having a diameter of from 0.04 inch to 0.12 inch. In some embodiments, the fluid agitator openings 270 can have a diameter of 0.03 inch such that the openings introduce bubbles into the fluid having a diameter of 0.03 inch. In this manner, the bubble introduce regions 266A-266C can introduce gas bubbles into the fluid having a greater degree of size uniformity than is possible by other methods, such as passing gas through a porous membrane directly into the fluid.

In alternative embodiments, the fluid agitator openings 270 can have any suitable diameter, and the diameter of the fluid agitator openings 270 can differ among the fluid agitator regions 266A-266C. In further alternative embodiments, the diameter of the different fluid agitator openings 270 can differ within each fluid agitator region 266A-266C, as desired.

In the embodiment shown, the fluid agitator openings 270 can be arranged in rows with substantially equal spacing between respective openings. In this manner, gas bubbles introduced into the fluid by the openings can be spaced apart from one another at about the same distance as the openings 270 from which they originate. This can result in a substantially uniform density of gas bubbles in the fluid adjacent each respective fluid agitator region 266A-266C. Alternatively, the fluid agitator openings 270 can have any suitable spacing within the fluid agitator regions 266A-266C, can be arranged in any suitable pattern, or can be arranged at random, depending upon the desired process characteristics.

Referring still to FIG. 5, the fluid reservoir assembly 200 can include a plurality of conduits to supply gas to the fluid agitator 206. In the embodiment shown, the fluid reservoir 200 can include a first set of gas supply conduits 272A-272C, and a second set of gas supply conduits 274A-274C configured to provide a supply of an inert gas (for example, nitrogen gas) at a predetermined pressure to the fluid agitator regions 266A-266C. The fluid reservoir assembly 200 can also include a set of fluid evacuation conduits 276A-276C, which can be situated between the first and second sets of gas supply conduits 272A-272C and 274A-274C, and can be configured to evacuate fluid from the main body portion 268 of the fluid agitator 206, as further described below. In the embodiment shown, the first and second sets of gas supply conduits 272A-272C, 274A-274C, and the fluid evacuation conduits 276A-276C, can be shaped such that the respective conduits extend from the underside of the fluid agitator 206, upwardly through the fluid reservoir 202, and outwardly through the upper portion 203 of the fluid reservoir 202 to connection points external to the fluid reservoir assembly 200 (see, e.g., FIG. 4).

Figure 6:
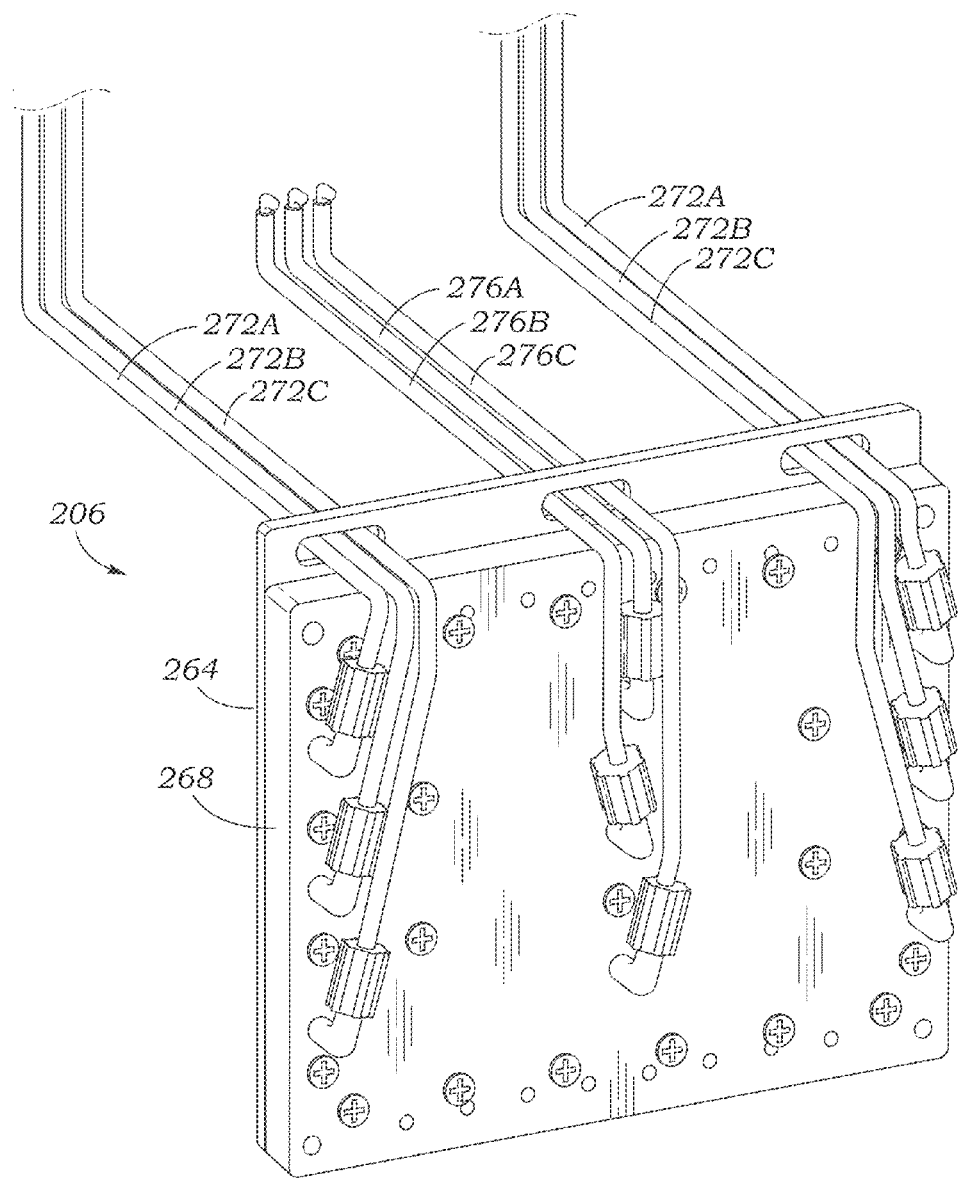
FIG. 6 illustrates a perspective view of the underside of the fluid agitator of FIG. 5.

FIG. 6 illustrates the respective connection points of the first and second sets of gas supply conduits 272A-272C, 274A-274C, and the fluid evacuation conduits 276A-276C on the underside of the fluid agitator 206. In the embodiment shown, the first set of gas supply conduits 272A-272C can be fluidly coupled to one side of the main body portion 268 of the fluid agitator 206 at locations corresponding to the fluid agitator regions 266A-266C, respectively. In other words, the gas supply conduit 272A can be coupled to the underside of the fluid agitator 206 opposite the fluid agitator region 266A, the gas supply conduit 272B can be coupled to the fluid agitator 206 opposite the fluid agitator region 266B, and the gas supply conduit 272C can be coupled to the fluid agitator 206 opposite the fluid agitator region 266C.

In an analogous manner, the second set of gas supply conduits 274A-274C can be fluidly coupled to the opposite side of the main body portion 268 of the fluid agitator 206 from the first set of gas supply conduits 272A-272C at respective locations corresponding to the fluid agitator regions 266A-266C. In other words, the gas supply conduit 274A can be coupled to the underside of the fluid agitator 206 opposite the fluid agitator region 266A, the gas supply conduit 274B can be coupled to the fluid agitator 206 opposite the fluid agitator region 266B, and the gas supply conduit 274C can be coupled to the fluid agitator 206 opposite the fluid agitator region 266C. In this manner, each of the fluid agitator regions 266A-266C can coupled to respective first and second gas supply conduit 272A-272C, 274A-274C, and can receive gas supplied therefrom, as further described below. However, in alternative embodiments, the fluid agitator 206 can include any suitable number of gas supply conduits and/or fluid evacuation conduits, which can be coupled to the fluid agitator 206 at any suitable location, as desired.

Figure 7:
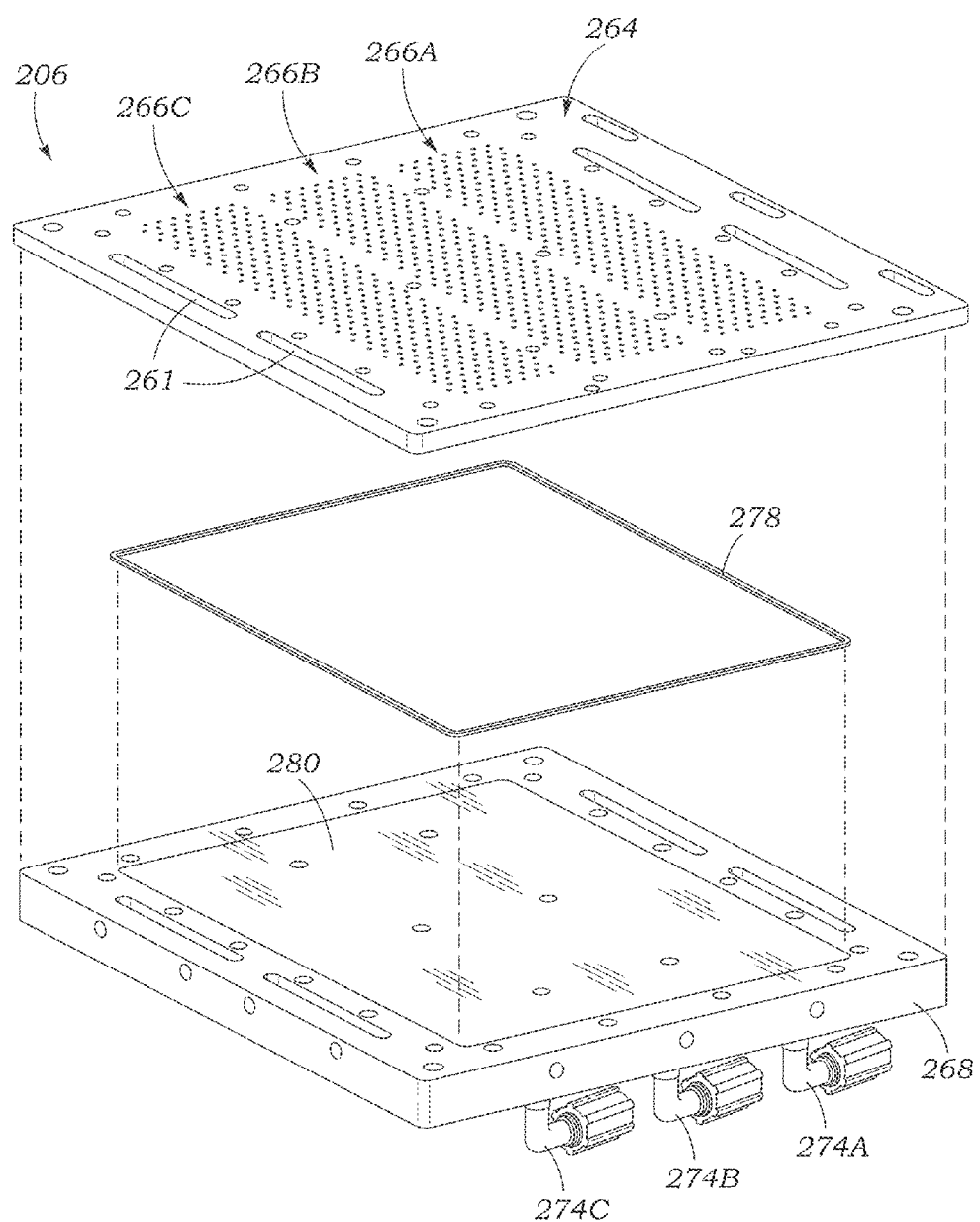
FIG. 7 illustrates a partially exploded view the fluid agitator assembly of FIG. 5.
Figure 8:
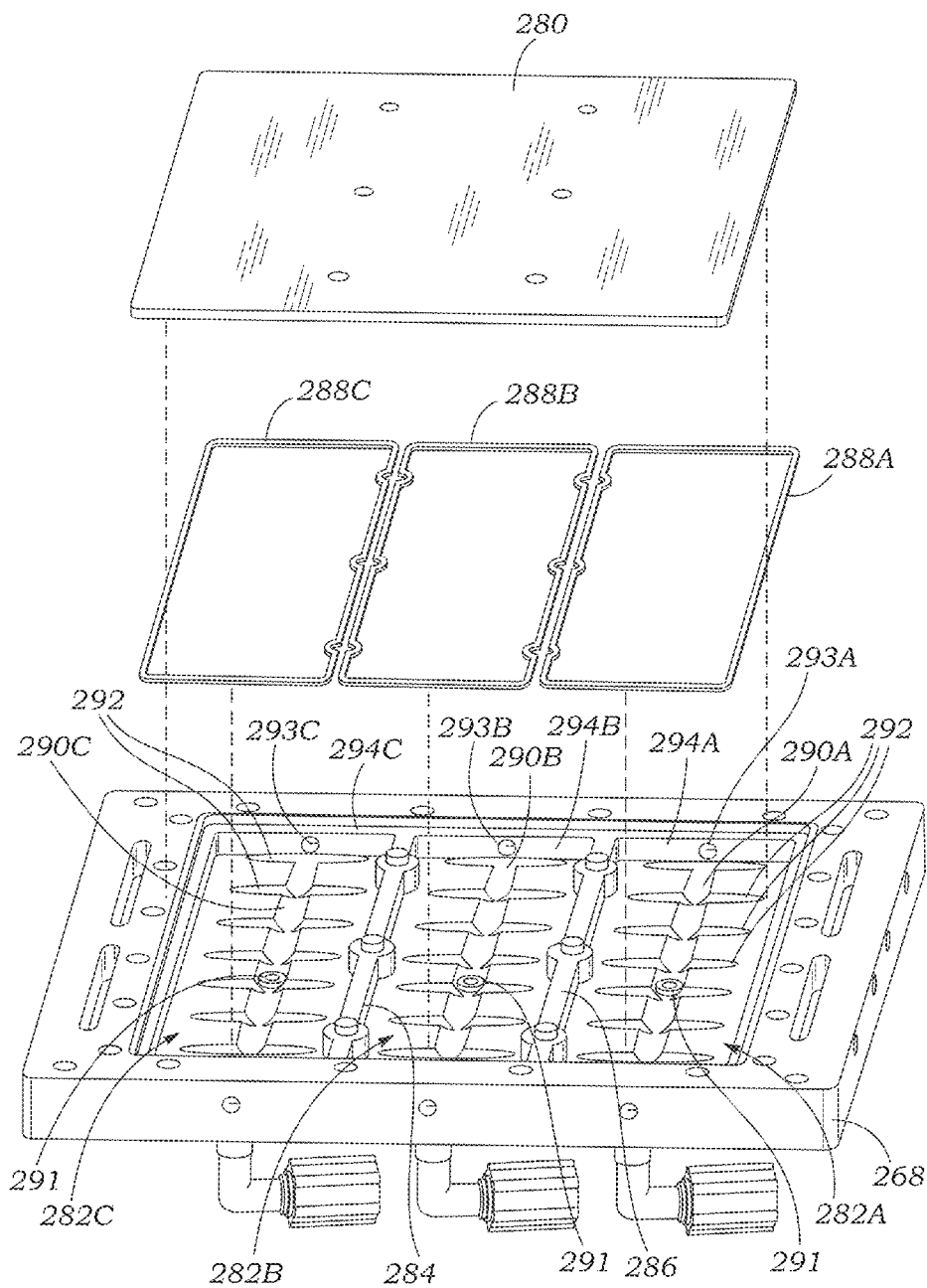
FIG. 8 illustrates an exploded view of the main body portion of the fluid agitator of FIG. 5.

FIGS. 7 and 8 illustrate exploded views of the fluid agitator 206 at varying levels of detail. FIG. 7 illustrates the main body portion 268 of the fluid agitator 206 separated from the top plate 264, and illustrates a sealing member 278 configured to be situated between the top plate 264 and a porous membrane 280 of the main body portion 268. The sealing member 278 can be configured to reduce leakage of fluid past the top plate 264 into the main body portion 268 when fluid is received in the fluid reservoir 202.

FIG. 8 illustrates an exploded view of the main body portion 268 of the fluid agitator 206. The main body portion 268 can include three recesses which, when covered by the porous membrane 280, can define three chambers 282A-282C corresponding to the three fluid agitator regions 266A-266C. The three chambers 282A-282C can be separated by respective divider members 284, 286, and can be sealed from one another and from the porous membrane 280 by respective sealing members 288A-288C. The chambers 282A-282C can define respective channels 290A-290C, which can extend along the length of the chambers 282A-282C, and can collect any fluid that leaks into the chambers 282A-282C past the sealing members 288A-288C and/or the sealing member 278.

Each of the chambers 280A-280C can include respective drain openings 291 defined near the centers of the respective channels 290A-290C. The channels 290A-290C can be sloped or graded such that any fluid that leaks into the chambers 282A-282C is induced to flow along the respective channels 290A-290C toward the drains 291. The respective drains 291 of the chambers 282A-282C can be in fluid communication with the respective fluid evacuation conduits 276A-276C via fittings such as fitting 295 of FIG. 9. In this manner, fluid received into the chambers 282A-282C can be evacuated via the respective fluid evacuation conduits 276A-276C. Each of the channels 290A-290C can also include a plurality of side channels 292, which can be configured to drain to the channels 290A-290C to facilitate collection and evacuation of fluid from the channels 290A-290C via the drains 291.

Figure 9:
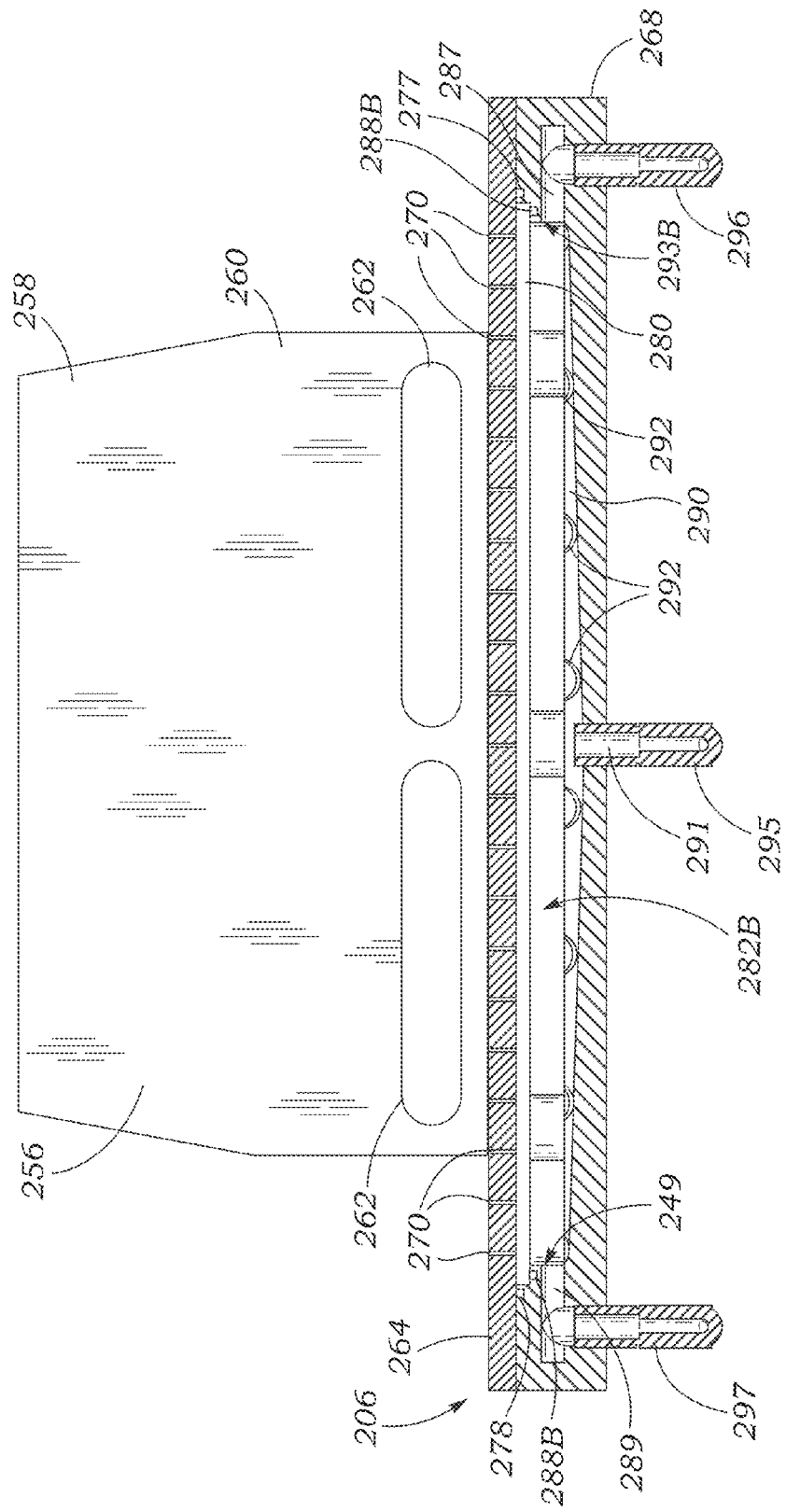
FIG. 9 illustrates cross-sectional view of the fluid agitator of FIG. 5.

Each of the chambers 282A-282C can also include gas inlet openings coupled to the respective first and second gas supply conduits 272A-272C, 274A-274C. For example, in the embodiment shown, each of the chambers 282A-282C can include respective gas inlet openings 293A-293C defined in respective side walls 294A-294C of the chambers 282A-282C. The gas inlet openings 293A-293C can be in fluid communication with the first gas supply conduits 272A-272C, respectively, via plenums such as plenum 287 defined in the main body portion 268, as illustrated in FIG. 9. The plenums such as plenum 287, in turn, can be in communication with fittings such as fitting 296 illustrated in cross-section in FIG. 9. Each of the chambers 282A-282C can also include analogous gas inlet openings defined in side walls opposite the side walls 294A-294C, such as gas inlet opening 294 illustrated in FIG. 9, which can be in fluid communication with the second gas supply conduit 274b via plenum 289 and fitting 297 (see FIG. 9). In this manner, each of the chambers 282A-282C can receive gas from respective first and second gas supply conduits 272A-272C and 274A-274C located at opposite ends of the respective chambers 282A-282C.

The porous membrane 280 can be situated between the chambers 282A-282C and the top plate 264 of the fluid agitator 206, as shown in FIGS. 7 and 8. The porous membrane 280 can be in fluid communication with the chambers 282A-282C and the fluid agitator regions 266A-266C such that gas can permeate through the porous membrane 280 from the chambers 282A-282C to the respective fluid agitator regions 266A-266C, where it can enter the fluid as gas bubbles via the openings 270. The porous membrane 280 can cooperate with the sealing members 288A-288C to seal the respective chambers 282A-282C from one another such that each chamber 282A-282C can receive gas at a different pressure and/or flow rate. For example, in some embodiments nitrogen gas at 1.0 psi can be introduced into the first chamber 282A at a rate of 5.5 standard cubic feet per hour, into the second chamber 282B at a rate of 3 standard cubic feet per hour, and into the third chamber 282C at a rate of 5 standard cubic feet per hour. The gas can then permeate through the regions of the porous membrane 280 adjacent the different chambers 282A-282C at different rates in accordance with the differing pressures and/or flow rates within each of the chambers 282A-282C.

In this manner, the fluid agitator regions 266A-266C can introduce gas bubbles into the fluid at different rates corresponding to the different gas pressures and/or flow rates within the respective chambers 282A-282C. The porous membrane 280 can also be configured to regulate the pressure within respective chambers 282A-282C over the area of the porous membrane 280 adjacent each of the chambers 282A-282C, such that gas permeates the porous membrane and, hence, bubbles form at the respective fluid agitator regions 266A-266C, at relatively uniform rates across the areas of the respective fluid agitator regions 266A-266C. In this manner, agitation of the fluid can be precisely controlled such that wafers 216 at each position in the cassette 210 experience similar fluid agitation and, thereby, material-etch rates. In some embodiments, the porous membrane 280 can be made from any suitable polymeric material, such as PTFE.

Referring to FIG. 10, prior to operation of the fluid reservoir assembly 200, a fluid can be introduced into the fluid reservoir 202. Fluid can flow through the inlets 246 into the diffuser chambers 252, as indicated by arrows 251 and 253, and from the diffuser chambers 252 into the fluid reservoir 202 and through the guide member openings 262 in the bubble guide members 256, as indicated by arrows 255 and 257. In some embodiments, fluid can be introduced into the fluid reservoir 202 at a generally constant flow rate during processing such that fluid flows upwardly through the cassette 210 in the direction of arrows 259, and out of the fluid reservoir 202 into the overflow enclosure 248. For example, in some embodiments, fluid can be introduced into the fluid reservoir 202 at a rate of from 10 liters per minute to 40 liters per minute, depending upon factors including the concentration of etchant in the fluid, the amount of material to be etched, etc.

In some cases, the fluid can include an etchant to etch a metal, such as gold, from the surfaces of the wafers 216. For example, in some embodiments, the fluid can include a mixture of nitric acid and hydrochloric acid in a ratio of 1:3 (sometimes referred to as aqua regia), which can etch gold at a rate of 10 µm/minute at room temperature. In some embodiments, the fluid can include a mixture of 1% iodine and 2-3% potassium iodide in a carrier fluid such as water, which can etch gold at a rate of 1 µm/minute. In some embodiments, the length of processing can be from 1 minute to 20 minutes, depending upon factors such as the material to be etched, the concentration of etchant(s) in the fluid, the temperature of the fluid, and/or the amount of material to be etched from the wafer surface. In some embodiments, the fluid can be an aqueous solution of sodium cyanide or potassium cyanide, or any other suitable etchant, as desired. In some embodiments, the fluid can be a $H_2O_2$ solution in a carrier fluid, such as water, and can be configured to etch TiW. In some embodiments, the $H_2O_2$ solution can have a concentration of from 2% to 30%. For example, in some embodiments, the fluid can be a 30% $H_2O_2$ solution, which can etch TiW at a rate of 5.7 A/s at a temperature of 50° C. for a processing time of 8.75 minutes.

Returning to FIG. 10, the cassette 210 containing a plurality of wafers 216 loaded into respective slots 218 can be lowered into the fluid reservoir 202 (for example, by the manipulator 110 of FIG. 1) until the cassette 210 contacts the bubble guide members 256. In some embodiments, the cassette 210 can be configured to receive, for example, 25 wafers 216, or any other suitable number of wafers 216. In some embodiments, the wafers 216 can have diameters of, for example, 75 mm, 100 mm, 125 mm, 200 mm, 300 mm, or any other suitable diameter, and can include layers or patterned features comprised of material to be etched. In some embodiments, the fluid reservoir 202 can be configured to etch, for example, palladium, aluminum, copper, molybdenum, rhodium, iridium, silver, copper, nickel, chromium, titanium, tantalum, zirconium, hafnium, niobium, tungsten, silicon, sapphire, or any combination thereof, from the surface of the wafers 216.

As the cassette 210 is lowered onto the bubble guide members 256, the roller member 204 can pass through the opening 220 in the bottom portion 214 of the cassette 210, contact (i.e., frictionally engage) the respective edge portions 222 of the wafers 216, and displace the wafers 216 relative to the bottom portion 214 of the cassette 210. With the cassette 210 fully received within the fluid reservoir 202 and resting atop the bubble guide members 256, the wafers 216 can then be rotated within the cassette 210 by rotating the roller member 204 (e.g., by activating the motor 224), as described above. In the embodiment shown, the wafers 216 are illustrated rotating in a clockwise direction, as indicated by arrow 249. However, it should be understood that the wafers 216 can be rotated in either a clockwise direction, a counterclockwise direction, or both a clockwise and counterclockwise direction during processing, as desired. The wafers 216 can also be rotated continuously or intermittently, and may be rotated while displaced from the bottom portion 214 of the cassette 210 or while being only slightly lifted such that the wafers are not in contact with the bottom portion 214 and/or the side walls 212 of the cassette 210, but are not lifted to an extent such that the wafers are "displaced" as used herein.

In some embodiments, prior to the introduction of gas into the chambers 282A-282C (or after a period of time during which gas is not provided to the chambers 282A-282C), fluid from the fluid reservoir 202 may leak into the chambers 282A-282C, and may interfere with the production of gas bubbles by the fluid agitator 206. Thus, prior to introducing gas into the fluid in the fluid reservoir 202, gas may be introduced into the chambers 282A-282C at high pressure for a relatively short duration such that any fluid that has accumulated in the chambers 282A-282C can be evacuated via the respective drains 291 and evacuation conduits 276A-276C (see, e.g., FIGS. 5 and 8). With the chambers 282A-282C cleared of fluid, gas can then be supplied to the respective chambers 282A-282C via the first and second gas supply conduits 272A-272C and 274A-274C. The gas can pass through the porous membrane 280 and flow through the openings 270 of the respective fluid agitator regions 266A-266C. The fluid agitator regions 266A-266C can thereby introduce gas bubbles 271 into the fluid, which can be guided into the cassette 210 by the bubble guide members 256, as illustrated in FIG. 10.

In some embodiments, gas can be provided to the chambers 282A-282C at one or more different pressures and/or flow rates such that gas bubbles 271 are produced by the respective fluid agitator regions 266A-266C at different rates, as described above. For example, in the embodiment shown, gas can be supplied to the chamber 282B at a lower flow rate than either the chamber 282A or the chamber 282C such that fewer gas bubbles 271 are introduced into the fluid at the central fluid agitator region 266B than at the fluid agitator regions 266A and 266C. This can result in a lower density of gas bubbles 271 in the fluid in the fluid reservoir 202 above the fluid agitator region 266B, corresponding generally to central regions 217 of the wafers 216, as shown in FIG. 10. As a result, fewer gas bubbles 271 can agitate the fluid adjacent the central regions 217 of the wafers 216, which can lower the rate at which material is etched from the central regions 217. This can result in greater within-wafer uniformity as compared to conventional wet-etching systems by reducing the rate at which material is etched from the central regions 217 of the wafers 216. This can also reduce "dishing" of the central regions 217 commonly associated with conventional wet-etching systems, wherein the central regions 217 are etched to a greater extent than the edge portions 222 of the wafers 216 such that the material of the edge portions 222 is thicker than the material of the central regions 217, resulting in a surface profile resembling a dish.

After the wafers 216 have been processed in the fluid reservoir 202, the cassette 210 may be removed from the fluid reservoir 202 and placed in, for example, a rinse tank (such as rinse tank 108 of FIG. 1, and/or lowered into a second fluid reservoir for further processing. In some embodiments, the fluid reservoir can include multiple roller members, multiple fluid agitators, and multiple sets of bubble guide members such that the fluid reservoir can receive and process multiple cassettes of wafers at one time.

Although the steps of the process above are described as occurring in a particular sequential order, it should be understood that operation fluid of the reservoir assembly 200 need not proceed in the order described above, but may proceed in any suitable sequence or with some steps occurring simultaneously, and need not include all of the steps recited above.

Example 3

Representative Gas Supply System

Figure 11:
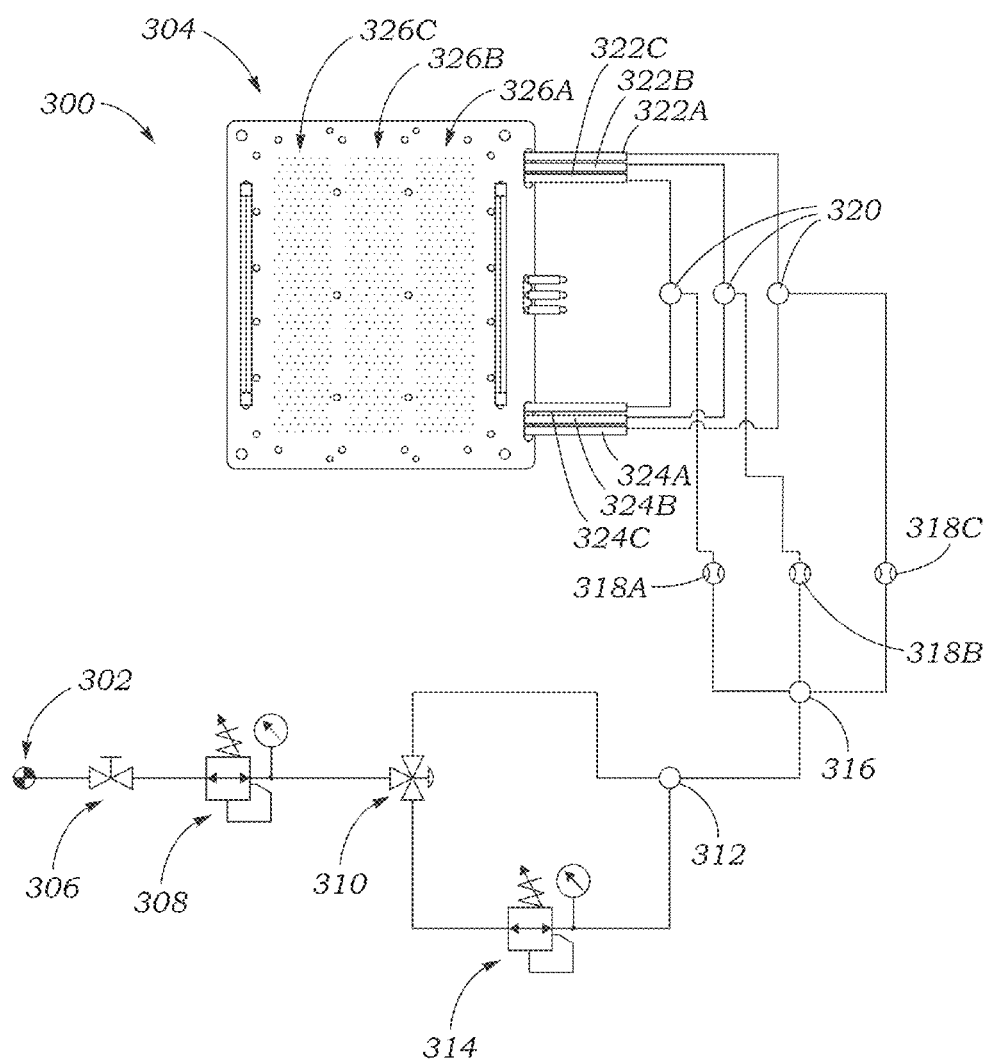
FIG. 11 is a schematic illustration of a representative embodiment of a gas supply system.

FIG. 11 is a schematic illustration of a representative gas supply system 300 for use with the wet-etching system 100 of FIG. 1. The system 300 can include a gas source 302 in fluid communication with a fluid agitator 304, which can be similar to the fluid agitator 206 of FIG. 2. The gas source 302 can be a source of an inert gas, and can be coupled to a two-way valve 306. The two-way valve 306 can be coupled to a high-pressure regulator 308, which can comprise a valve configured to receive gas from the source 302 and limit the pressure of the gas to a first predetermined pressure. The high-pressure regulator 308 can be coupled to a three-way valve 310, which can allow gas to flow from the high-pressure regulator 308 either directly to a coupling element 312, or to pass through a low-pressure regulator 314 prior to flowing to the coupling element 312. The low-pressure regulator 314 can reduce the pressure of the gas from the first predetermined pressure to a second predetermined pressure, which can be lower than the first predetermined pressure. Thus, the three-way valve 310 can either direct gas from the high-pressure regulator to the coupling element 312 directly at the first predetermined pressure, or via the low-pressure regulator 314, which can reduce the pressure of the gas to the second predetermined pressure. In some embodiments, gas can be supplied to the fluid agitator 302 at the first predetermined pressure when, for example, fluid is to be evacuated from chambers such as the chambers 282A-282C in the embodiment of FIG. 2. In some embodiments, gas can be supplied to the fluid agitator 302 at the second predetermined pressure when, for example, gas bubbles are to be introduced into a fluid in a fluid reservoir in which the fluid agitator 302 is situated during wafer processing.

The coupling element 312 can be coupled to a flow dividing element 316 which can receive gas from the coupling element 312 and divide the gas into three separate flows. The flow dividing element 316 can be configured to provide a separate flow of gas to three adjustable flow meters 318A-318C. In some embodiments, the adjustable flow meters 318A-318C can be configured to regulate or adjust the quantity of gas flowing through the respective flow meters 318A-318C to control, for example, the number of, size, and/or frequency of bubbles introduced into the fluid. Information of the flow rate and/or pressure of the gas flowing through each of the flow meters 318A-318C can be provided to a computer system, which can control the respective flow rates and pressures in accordance with instructions for the particular etching process to be carried out.

Each of the adjustable flow meters 318A-318C, in turn, can be coupled to respective secondary flow dividing elements 320, which can further subdivide the gas flows received from the adjustable flow meters 318A-318C, respectively, among conduits 322A and 324A, 322B and 324B, and 322C, and 324C, respectively. In some embodiments, the conduits 322A-322C and 324A-324C can correspond to the first and second gas supply conduits 272A-272C and 274A-274C of the embodiment of FIG. 2. The conduits 322A and 324A can be in fluid communication with a fluid agitator region 326A, the conduits 322B and 324B can be in fluid communication with a fluid agitator region 326B, and the conduits 322C and 324C can be in fluid communication with a fluid agitator region 326C. Thus, the system 300 can supply gas to the fluid agitator regions at either the first or second predetermined pressures, and at flow rates determined by the flow meters 318A-318C, as desired.

Example 4

Representative Etch Uniformity of Wafers

Figure 12:
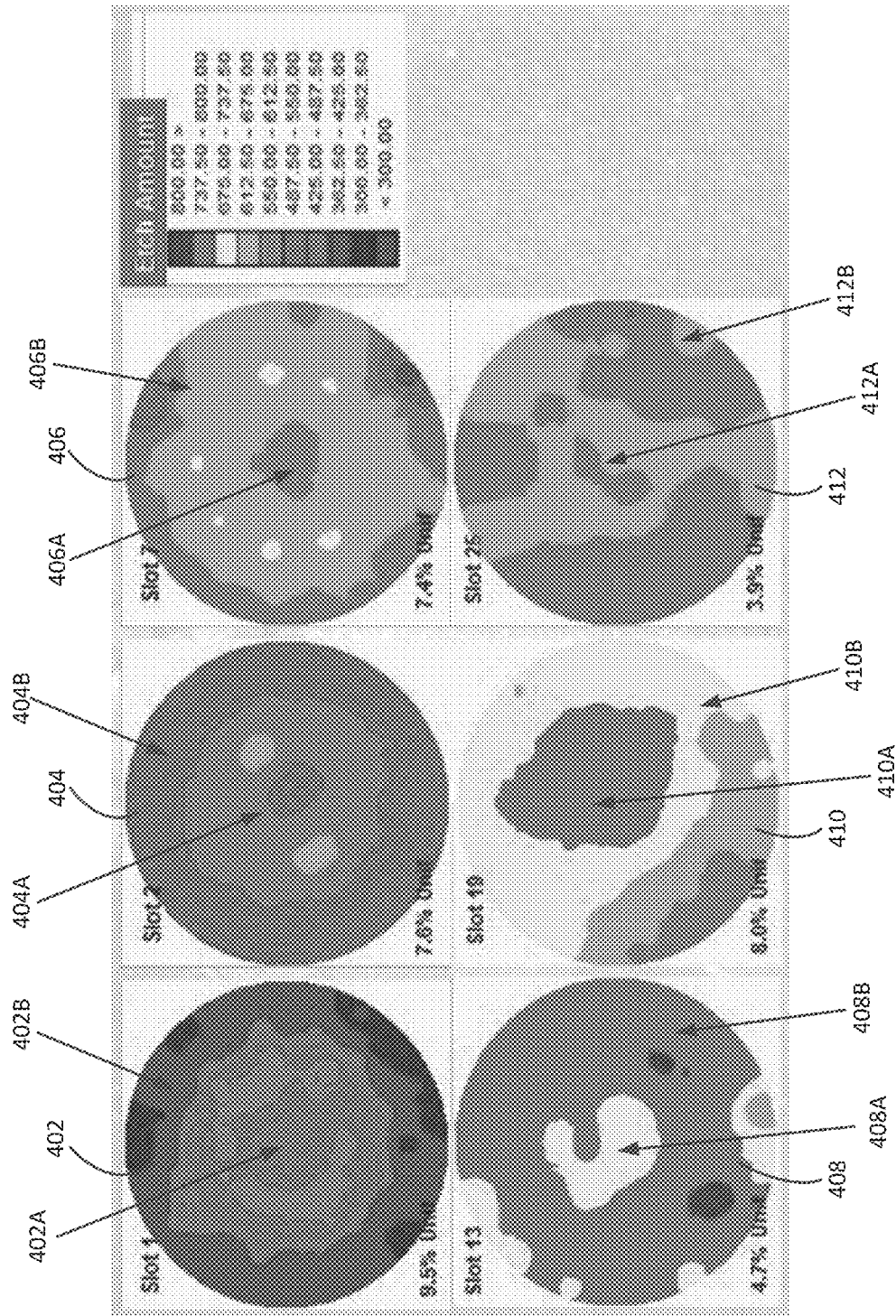
FIG. 12 is a plan view of a plurality of wafers illustrating relative surface uniformity of the wafers.

FIG. 12 illustrates etching profiles of six wafers 402, 404, 406, 408, 410, 412 processed in a fluid reservoir assembly similar to the assembly 200 of FIG. 2, in which the introduction of gas bubbles was uniform among the three fluid agitator regions as the wafers were rotated. Thus, the entire surface of each of the wafers 402-412 experienced a relatively uniform flow of gas bubbles. As shown in FIG. 12, this can result in central portions 402A-412A of the wafers 402-412 experiencing a greater material etch rate than edge portions 402B-412B, resulting in a surface profile wherein the central portions 402A-412A are dished (i.e., lower) relative to the edge portions 402B-412B.

This can also result in varying degrees of surface uniformity among the wafers 402-412 according to their position in the cassette. For example, wafers 402, 404, 406, and 410 in slots 1, 2, 7, and 19, respectively, display relatively high surface uniformity rates of 9.5%, 7.6%, 7.4%, and 8.0%, respectively, despite having been processed together. In contrast, wafers 408 and 412 in slots 13 and 25, respectively, display relatively low surface uniformity rates of 4.6% and 3.9%, respectively. Such dished patterns and disparities in surface uniformity among wafers in different positions in the cassette can be reduced by displacing the wafers from the bottom portion of the cassette, rotating the wafers in the cassette, and varying the rate at which gas bubbles flow across the central portions of the wafers as compared to the edge portions of the wafers during processing.

Figure 13:
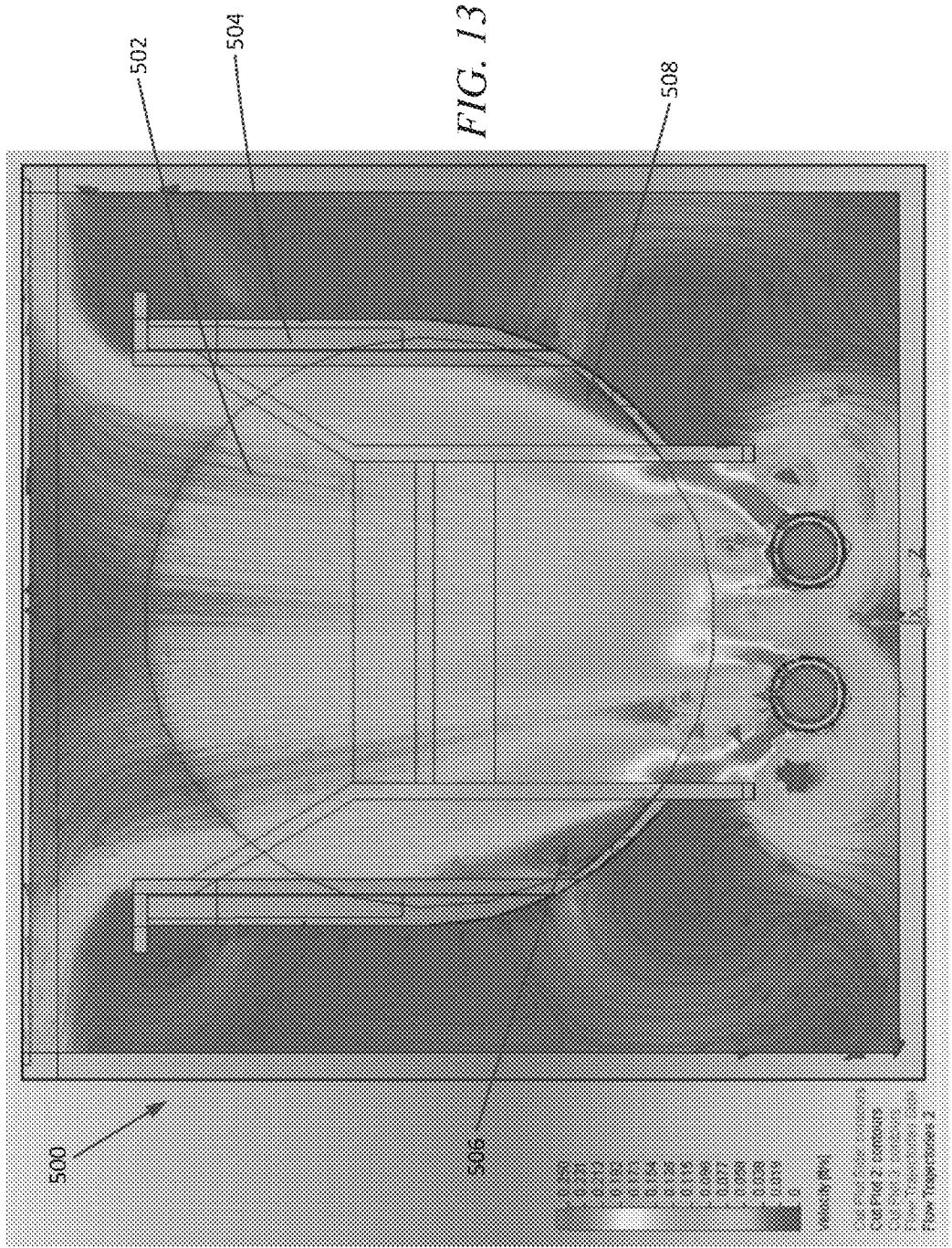
FIG. 13 illustrates a computer simulation of flow velocities of a fluid through a fluid reservoir assembly similar to the fluid reservoir assembly of FIG. 2.
Figure 14:
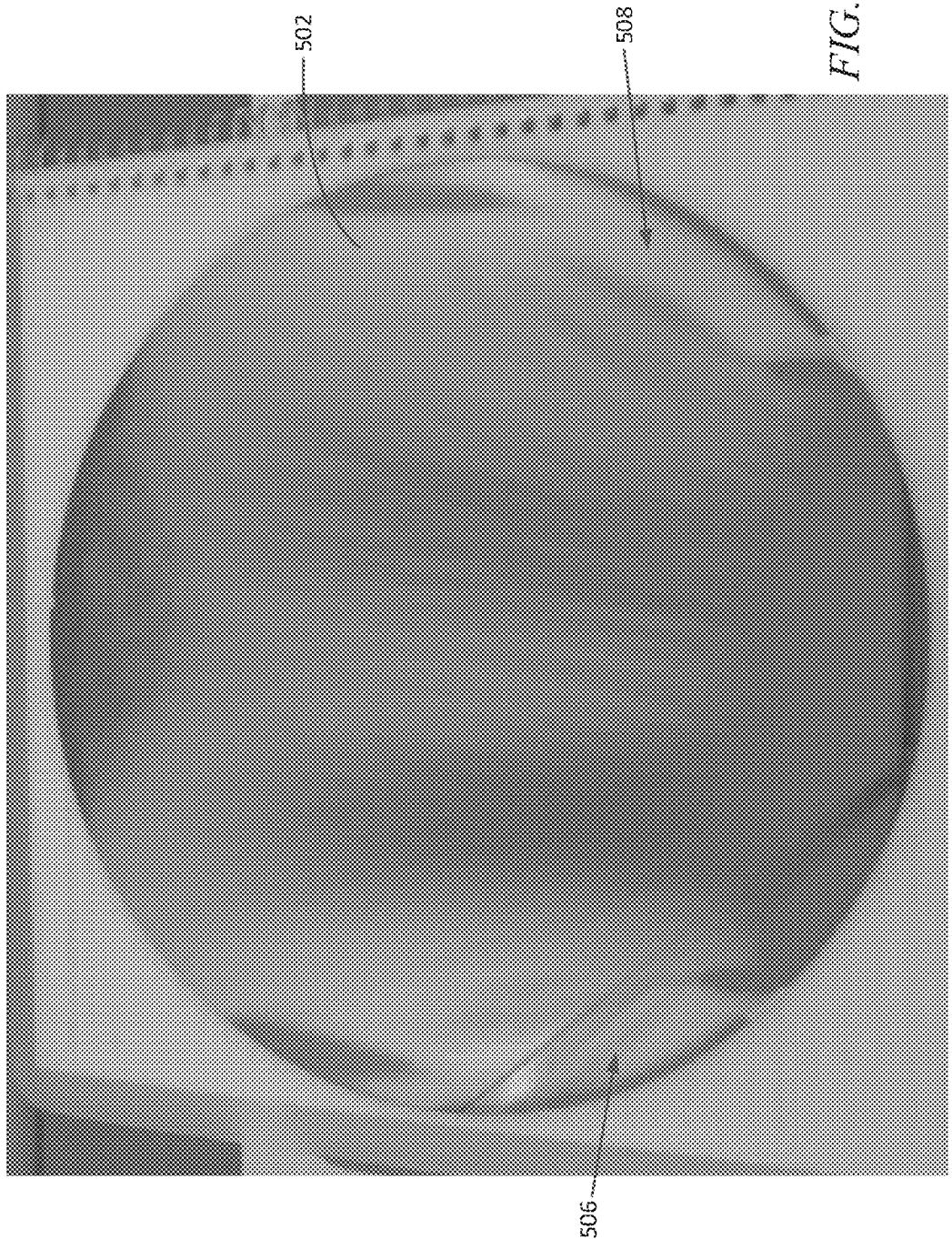
FIG. 14 illustrates a wafer processed in the fluid reservoir assembly of FIG. 13.

Displacing the wafers from the bottom portion of the cassette, rotating the wafers in the cassette, and varying the rate at which gas bubbles flow across the central portions of the wafers as compared to the edge portions of the wafers during processing surprisingly significantly improve etch uniformity, perhaps due to compensating for varying flow velocities of the etching fluid at different regions within the fluid reservoir. FIG. 13 illustrates a computer simulation of flow velocities of a fluid through a fluid reservoir 500 similar to the fluid reservoir 202 of FIG. 2 with respect to a wafer 502 situated in a cassette 504. The lighter regions of FIG. 13 generally indicate a higher fluid velocity, while the darker regions generally indicate a lower fluid velocity. As illustrated in FIG. 13, the cassette 504 can cause a reduction in flow velocity (i.e., a "shadow") in regions where the walls of the cassette 504 are adjacent the wafer 502, such as regions 506 and 508. This can result in a lower material etch rate in those regions, as illustrated in FIG. 14. In FIG. 14, the lighter shade of regions 506 and 508 indicate that less material has been etched from the surface of the wafer 502 as a result of the lower fluid velocity across the regions 506, 508 caused by the proximity of the cassette 504 to the wafer 502. It has been surprisingly discovered by the inventors that displacing the wafers from the bottom portion of the cassette, rotating the wafers in the cassette, and varying the rate at which gas bubbles flow across the central portions of the wafers as compared to the edge portions of the wafers during processing act together to compensate for inconsistent etching rates at different portions of the wafer surface due to differences in etching fluid velocity and relative location of a wafer within the cassette, providing surprisingly superior results.

Figure 15:
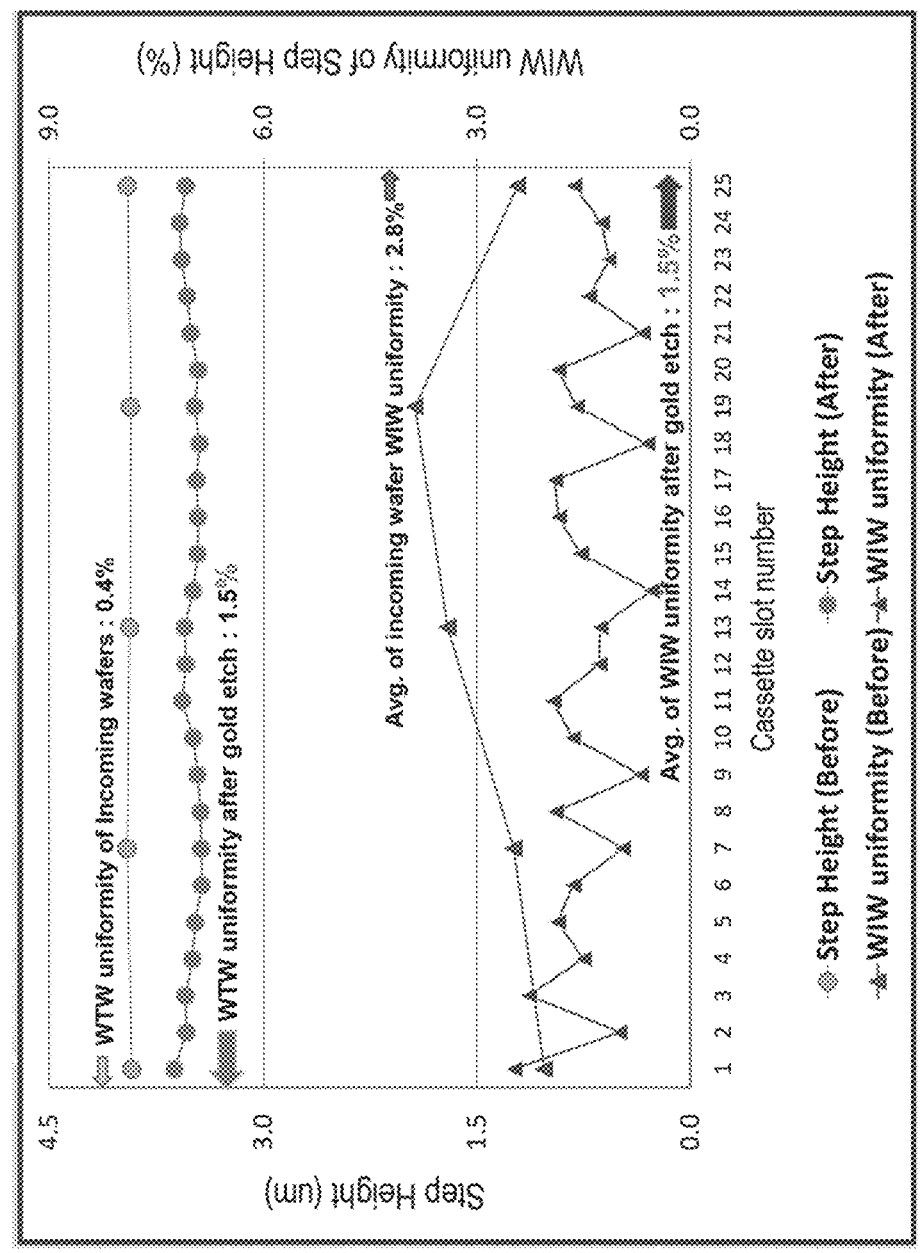
FIG. 15 is a chart illustrating certain embodiments' within-wafer-uniformity values for wafers placed in slots 1-25 of a cassette before and after processing in a fluid reservoir assembly.

For example, it has been found that certain embodiments of the systems described herein can provide greatly improved within-wafer (WIW) uniformity, such as WIW uniformities below 5%. Referring to FIG. 15, certain embodiments of the systems described herein have been used to achieve WIW uniformities less than 2% for a 200 mm wafer. As shown in FIG. 15, wafers displaying WIW uniformities of 2.8% prior to processing have achieved WIW uniformities of 1.8% after processing by embodiments of the wet-etching systems described herein. In other words, certain embodiments of the systems described herein can process wafers such that the resulting processed wafers have a better overall surface uniformity than before the wafers were processed in the wet-etching system. FIG. 15 also illustrates that wafer-to-wafer uniformity, a measure of the variation of the average planarization of the wafer surface amongst different wafers, can increase after processing in wet-etching systems.

Certain embodiments of the systems described herein are significantly less expensive than conventional systems. Certain embodiments of the systems described herein are more compact than conventional systems, requiring less physical space in a production facility such as a cleanroom, which adds additional cost savings. Further, certain embodiments of the systems described herein improve etching quality while reducing the quantity of etchant chemicals required, for example, by using the bubbles to agitate the fluid to replenish the etchant at the surface of the wafers. As a result, such embodiments improve chemical usage by allowing a higher proportion of the etchant in a given volume of fluid to interact with the surfaces of the wafers. Further, certain embodiments of the systems described herein can provide greater throughput, for example, by allowing at least 25 wafers to be processed concurrently. Further, certain embodiments of the systems described herein can be easier to maintain and increase production rates relative to other known systems.

Example 5

Exemplary Wafer Surface Pattern

Figure 16:
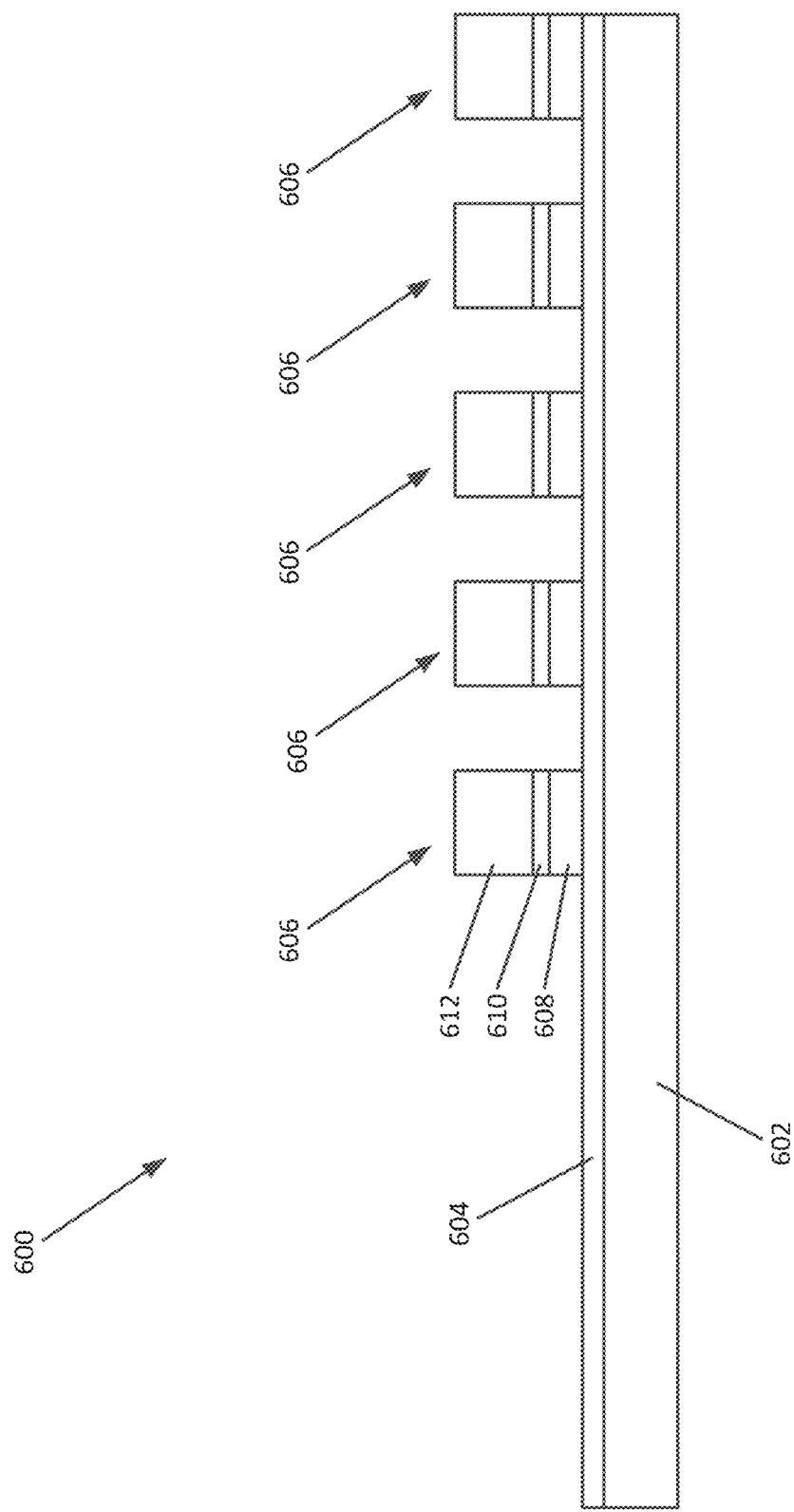
FIG. 16 is a cross-sectional view of a wafer illustrating representative features on the wafer surface that may be processed with the fluid reservoir assembly of FIG. 2.

Certain embodiments of the systems described herein eliminate processing steps required by conventional wet-etching systems to process certain features. For example, FIG. 16 illustrates a cross section of a wafer 600 including a silicon substrate 602, a chemical vapor-deposited (CVD) $SiO_2$ layer 604, and five features 606, each including a TiW base layer 608, a physical vapor-deposited (PVD) gold intermediate layer 610, and a plated gold top layer 612. In some cases, the layers 608 can have thicknesses of 3 kA, the layers 610 can have thicknesses of 1 kA, and the layers 612 can have thicknesses of 5 µm.

To process a wafer such as wafer 600, many conventional etching systems require two separate tools: a first, wet-etching tool to etch the gold layers, and a second, dry-etching tool to etch the TiW layers. The dry-etching tool is often required because use of conventional wet-etching tools to process TiW features typically results in high levels of undesirable undercutting of the TiW features. Certain embodiments of the systems disclosed herein can be used to etch both the gold layers and the TiW layers using wet-etching processes available on a single tool. For example, a wafer such as the wafer 600 can first be processed in a gold-etching fluid reservoir, then rinsed in a rinse fluid reservoir, then processed in a TiW-etching fluid reservoir. By displacing the wafer 600 from the bottom portion of the cassette, rotating the wafer 600 in the cassette, and varying the rate at which gas bubbles flow across the central portion of the wafer 600 as compared to the edge portions of the wafer 600 during processing, certain embodiments of the systems described herein can etch the TiW layer 608 between the features 606 with minimal undercutting.

Additional wafer features that may be processed using the systems and methods described herein include blankets (i.e., relatively flat metal surfaces) and micro coils.

Representative Computing Environment

In some cases, the systems described herein, such as the wet-etching system 100 and the fluid reservoir assembly 200, can include a computer system (not shown) for controlling the various operations and processes of the described systems. In some cases, such a computer system can control the operation of any of the devices or systems described herein, such as any of the components of the fluid reservoir assembly 200. The computer system can include one or more processing units and one or more memory units. The processing units can execute computer-executable instructions, and can be any type of processors. The memory can be tangible, and can be volatile memory (e.g., registers, cache, RAM), non-volatile memory (e.g., ROM, EEPROM, flash memory, etc.), or some combination of the two, accessible by the processing unit(s). The memory can store software implementing one or more innovations described herein, in the form of computer-executable instructions suitable for execution by the processing unit(s). The computer system can have additional features, such as storage, input devices, output devices, and one or more communication connections. An interconnection mechanism as known to those of ordinary skill in the art, such as a bus, controller, or network may be used to interconnect the components of the computer system. Typically, operating system software provides an operating environment for other software executing in the computer system, and coordinates activities of the components of the computer system.

Storage can include removable or non-removable storage, and includes magnetic disks, magnetic tapes or cassettes, CD-ROMs, DVDs, or any other medium which can be used to store information in a non-transitory way and which can be accessed within the computer system. The storage stores instructions for the software implementing one or more innovations described herein. Input device(s) may be touch input devices such as a keyboard, mouse, pen, or trackball, a voice input device, a scanning device, or another device that provides input to the computer system. For video encoding, the input device(s) may be a camera, video card, TV tuner card, or similar device that accepts video input in analog or digital form, or a CD-ROM or CD-RW that reads video samples into the computing system. The output device(s) may include a display, printer, speaker, CD-writer, or another device that provides output from the computing system.

The communication connection(s) can enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

In view of the many possible embodiments to which the principles of the disclosure may be applied, it should be recognized that the illustrated embodiments are only representative examples and should not be taken as limiting the scope of the disclosure. Rather, the scope of the disclosure is defined by the following claims.

What is claimed is:

1. An apparatus comprising:
a fluid reservoir configured to receive a fluid including an etchant and a cassette configured to receive a plurality of wafers;
a roller member in the fluid reservoir to frictionally engage the wafers when the cassette is in the fluid reservoir; and
a motor situated outside the fluid reservoir and coupled to the roller member such that activation of the motor causes corresponding rotation of the roller member and rotation of the wafers when the roller member is in frictional engagement with the wafers; and
a fluid agitator in fluid communication with the fluid reservoir to introduce bubbles into the fluid when the fluid is in the fluid reservoir, the fluid agitator further comprising a first fluid agitator region and a second fluid agitator region, the first and second fluid agitator regions defining a plurality of openings for forming bubbles of a predetermined size when a gas is passed therethrough, the first fluid agitator region being configured to introduce bubbles into the fluid at a first rate and the second fluid agitator region being configured to introduce bubbles into the fluid at a second rate, the second rate being higher than the first rate, the first fluid agitator region being located such that when the cassette is received in the fluid reservoir, bubbles introduced into the fluid from the first fluid agitator region will flow adjacent respective central regions of the wafers, and the second fluid agitator region being located such that when the cassette is received in the fluid reservoir, bubbles introduced into the fluid from the second fluid agitator region will flow adjacent respective edge portions of the wafers while the central regions of the wafers will remain substantially free of bubbles introduced into the fluid from the second fluid agitator region;
wherein the wafers are displaced with respect to a bottom portion of the cassette when the cassette is in the fluid reservoir to promote fluid flow across the wafers.

2. The apparatus of claim of claim 1, wherein the motor is magnetically coupled to the roller member across a wall of the fluid reservoir.

3. A wet-etching tool including the apparatus of claim 1.

4. The apparatus of claim 1, wherein the fluid agitator is located underneath the roller member such that the fluid agitator is below the wafers when the cassette is received in the fluid reservoir.

5. The apparatus of claim 1, wherein the bottom portion of the cassette defines an opening to allow bubbles introduced into the fluid by the fluid agitator to pass through the cassette when the cassette is received in the fluid reservoir.

6. The apparatus of claim 5, further comprising one or more bubble guide members to guide bubbles introduced into the fluid by the fluid agitator through the opening and into the cassette.

7. The apparatus of claim 5, wherein the fluid reservoir is configured such that the roller member passes through the opening defined in the bottom portion of the cassette when the cassette is received in the fluid reservoir such that the wafers are displaced from the bottom portion of the cassette by the roller member.

8. An apparatus, comprising:
a fluid reservoir configured to receive a fluid including an etchant and a cassette configured to receive a plurality of wafers;
a roller member in the fluid reservoir to frictionally engage the wafers when the cassette is in the fluid reservoir;
a motor situated outside the fluid reservoir and coupled to the roller member such that activation of the motor causes corresponding rotation of the roller member and rotation of the wafers when the roller member is in frictional engagement with the wafers; and
a fluid agitator in fluid communication with the fluid reservoir to introduce bubbles into the fluid when the fluid is in the fluid reservoir, the fluid agitator comprising a first fluid agitator region capable of introducing bubbles into the fluid at a first flow rate, and a second fluid agitator region capable of introducing bubbles into the fluid at a second flow rate that is higher than the first flow rate;
wherein the first fluid agitator region is situated such that bubbles introduced into the fluid from the first fluid agitator region will flow adjacent respective central regions of the wafers, and the second fluid agitator region is situated such that bubbles introduced into the fluid from the second fluid agitator region will flow adjacent respective edge portions of the wafers in contact with the cassette while the central regions of the wafers will remain substantially free of bubbles introduced into the fluid by the second fluid agitator region.

9. The apparatus of claim 8, wherein the roller member is configured to displace the wafers in the cassette when the cassette is in the fluid reservoir.

10. The apparatus of claim 8, further including wafer displacing means for displacing the wafers in the cassette when the cassette is in the fluid reservoir.

11. The apparatus of claim 10, wherein the wafer displacing means comprises a displacement member configured to displace the wafers independent of the roller member.

12. The apparatus of claim 11, wherein the displacement member is configured to allow the wafers to be rotated by the roller member.

13. A method, comprising:
positioning a cassette in a fluid reservoir containing a fluid, the cassette including a plurality of wafers situated therein;
displacing the wafers from a bottom portion of the cassette;
rotating the wafers relative to the cassette; and
bubbling a gas through the fluid in the fluid reservoir such that bubbles pass through the cassette adjacent the wafers as the wafers are rotated;
wherein bubbling a gas through the fluid further comprises bubbling gas across respective central regions of the wafers at a first flow rate, and bubbling gas across respective edge portions of the wafers at a second flow rate such that the central regions of the wafers remain substantially free of gas bubbled at the second flow rate, the second flow rate being higher than the first flow rate.

14. The method of claim 13, wherein positioning the cassette further comprises positioning the cassette adjacent one or more bubble guide members.

15. The method of claim 13, wherein the wafers are continuously rotated while displaced from the bottom portion of the cassette.

16. The method of claim 13, wherein rotating the wafers further comprises intermittently rotating the wafers.

17. The method of claim 16, wherein intermittently rotating the wafers occurs independently of the displacing the wafers.

18. The method of claim 16, wherein the wafers are intermittently rotated while simultaneously being displaced from the bottom portion of the cassette.

19. The method of claim 13, wherein displacing the wafers further comprises positioning the cassette with respect to a roller member such that the roller member contacts the wafers.

20. The method of claim 19, wherein rotating the wafers further comprises rotating the roller member.

21. The method of claim 20, wherein rotating the wafers further comprises magnetically coupling a motor to the roller member across a wall of the fluid reservoir such that activation of the motor causes corresponding rotation of the roller member.

22. An apparatus, comprising:
a fluid reservoir configured to receive a plurality of wafers in a cassette;
a roller member in the fluid reservoir to frictionally engage the wafers when the cassette is in the fluid reservoir and to displace the wafers with respect to a bottom portion of the cassette such that the wafers can be rotated by the roller member within the cassette when displaced;
a motor outside the fluid reservoir and magnetically coupled to the roller member such that activation of the motor causes corresponding rotation of the roller member, and thereby rotation of the wafers when the cassette is received in the fluid reservoir;
a fluid agitator in fluid communication with the fluid reservoir to introduce gas bubbles of a predetermined size into a fluid when the fluid is received by the fluid reservoir; and
one or more bubble guide members extending from the fluid agitator such that gas bubbles introduced into the fluid by the fluid agitator are guided into the cassette by the one or more bubble guide members.

23. The apparatus of claim 22, wherein the fluid agitator is configured to introduce gas into the fluid at a first flow rate such that gas bubbles move through the fluid adjacent a central portion of the wafers at a rate corresponding to the first flow rate.

24. The apparatus of claim 23, wherein the fluid agitator is configured to introduce gas into the fluid at a second flow rate such that gas bubbles move through the fluid adjacent an edge portion of the wafers at a rate corresponding to the second flow rate.

* * * * *